US008050804B2

(12) United States Patent
Kernahan

(10) Patent No.: US 8,050,804 B2
(45) Date of Patent: Nov. 1, 2011

(54) DETECTION AND PREVENTION OF HOT SPOTS IN A SOLAR PANEL

(75) Inventor: Kent Kernahan, Cupertino, CA (US)

(73) Assignee: Array Converter, Inc., Cupertino, CA (US)

( * ) Notice: Subject to any disclaimer, the term of this patent is extended or adjusted under 35 U.S.C. 154(b) by 424 days.

(21) Appl. No.: 12/335,357

(22) Filed: Dec. 15, 2008

(65) Prior Publication Data
US 2010/0152917 A1 Jun. 17, 2010

(51) Int. Cl.
*G05D 3/12* (2006.01)
*G05F 5/00* (2006.01)
*H01L 31/00* (2006.01)

(52) U.S. Cl. ........ 700/298; 700/286; 700/297; 323/299; 323/906; 136/255

(58) Field of Classification Search .................. 700/298, 700/286, 297; 323/299, 906, 95; 136/255
See application file for complete search history.

(56) References Cited

U.S. PATENT DOCUMENTS

| | | | |
|---|---|---|---|
| 4,375,662 A | 3/1983 | Baker | |
| 4,453,383 A | 6/1984 | Collins | |
| 5,892,354 A * | 4/1999 | Nagao et al. .................. | 323/299 |
| 6,690,590 B2 | 2/2004 | Stamenic et al. | |
| 7,171,665 B1 * | 1/2007 | Kobayashi et al. ........... | 718/103 |
| 2007/0119718 A1 * | 5/2007 | Gibson et al. .................. | 205/637 |
| 2008/0191666 A1 * | 8/2008 | Kernahan et al. ............. | 320/150 |
| 2008/0306700 A1 * | 12/2008 | Kawam et al. .................. | 702/64 |
| 2009/0032093 A1 * | 2/2009 | Fang ............................. | 136/255 |
| 2010/0139752 A1 * | 6/2010 | Fang ............................. | 136/255 |

OTHER PUBLICATIONS

C. Liu et al., "Advanced Algorithm for MPPT Control of Photovoltaic Systems," Dept. of Electrical & Computer Engineering, Ryerson University; Canadian Solar Buildings Conference, Aug. 20-24, 2004, Montreal, Canada.
G.M.S. Azavedo et al., "Comparative Evaluation of Maximum Power Point Tracking Methods for Photovoltaic Systems," Journal of Solar Energy Engineering, Aug. 2009, vol. 131.
N. Moubayed et al., "A Comparison of Two MPPT Techniques for PV System," WSEAS Transactions on Environment & Development, Issue 12, vol. 5, Dec. 2009.
Faranda et al., "Energy Comparison of MPPT Techniques for PV Systems," WSEAS Transactions on Power Systems, Issue 6, vol. 3, Jun. 2008.
Chao et al., "An Intelligent Maximum Power Point Tracking Method Based on Extension Theory for PV Systems," Expert Systems with Applications, Copyright 2009 Elsevier Ltd.
C.A.G. Castaneda, "Maximum Power Point Tracking Using Modified P&O Method for the Off Grid Radar," Master of Science in Electrical Engineering Thesis, University of Puerto Rico—Mayaguez; 92pgs, 2008.

(Continued)

*Primary Examiner* — Ramesh Patel
*Assistant Examiner* — Jason Lin
(74) *Attorney, Agent, or Firm* — The Marbury Law Group, PLLC

(57) ABSTRACT

An electronic module compares the output voltage of a solar panel to an expected value and controls the power demand from the solar panel such that the output voltage does not vary from the expected value by more than a predetermined value. The predetermined value may be determined by correcting a room temperature value for the temperature dependence of the photodiodes comprising the solar panel and manufacturing tolerance.

21 Claims, 18 Drawing Sheets

OTHER PUBLICATIONS

W. Xiao, "A Modified Adaptive Hill Climbing Maximum Power Point Tracking (MPPT) Control Method for Photovoltaic Power Systems," Master of Applied Science Thesis, University of British Columbia, Jul. 2003, 116pgs.

M. Azab, "A New Maximum Power Point Tracking for Photovoltaic Systems," Proceedings of World Academy of Science, Engineering & Technology, vol. 34, Oct. 2008, pp. 571-574.

E. V. Solodovnik et al., "Power Controller Design for Maximum Power Tracking in Solar Installations," IEEE Transactions on Powers Electronics, vol. 19, No. 5, Sep. 2004, pp. 1295-1304.

T. Esram et al., "Dynamic Maximum Power Point Tracking of Photovoltaic Arrays Using Ripple Correlation Control," IEEE Transactions on Power Electronics, vol. 21, No. 5, Sep. 2006, pp. 1282-1291.

Chou et al., "Techniques for Maximizing Efficiency of Solar Energy Harvesting Systems," Proceedings of the Fifth Conference on Mobile Computing and Ubiquitous Networking (ICMU 2010), Seattle, WA, Apr. 26-28, 2010, 7pgs.

E. Koutroulis et al., "Development of a Microcontroller-Based, Photovoltaic Maximum Power Point Tracking Control System," IEEE Transactions on Power Electronics, vol. 16, No. 1, Jan. 2001, pp. 46-54.

J. Ahmad et al., "A Voltage Based Maximum Power Point Tracker for Low Power and Low Cost Photovoltaic Applications," World Academy of Science, Engineering & Technology, vol. 60, 2009, pp. 712-715.

S. Roberts, "Peak Power Tracker Project," The Microship Status Reports, Mar. 14, 1997, Issue No. 118, www.microship.com., 6pgs.

H. Knopf, "Analysis, Simulation, & Evalution of Maximum Power Point Tracking (MPPT) Methods for a Solar Powered Vehicle," Master of Science in Electrical & Computer Engineering Thesis, Portland State University, 1999, 177pgs.

C. Eskow, "What You Need to Know About MPPT for PV Arrays," Energy Efficiency & Technology, Sep. 1, 2009, 3pgs.

International Preliminary Report on Patentability issued in PCT Application PCT/US2009/067951, mailed on Jun. 30, 2011.

* cited by examiner

DETECTION AND PREVENTION OF HOT SPOTS IN A SOLAR PANEL

CROSS-REFERENCE TO RELATED APPLICATIONS

This application is related to commonly-owned U.S. patent application Ser. No. 12/061,025 submitted Apr. 2, 2008 by Kernahan et al, which application is incorporated herein in its entirety.

BACKGROUND

Solar panels are expected by their makers to last at least twenty five years. One of many lifetime-limiting conditions to be dealt with to enable such a long lifetime is hot spots on the panel. Hot spots may limit lifetime by causing damage to the panel due to heat generated and/or longer term degradation of the panel cell material due to diffusion aging. Failure modes include melting solder joints, pin holes or open circuits in a cell, and damage to the panel case. Some causes of hot spots are manufacturing related, such as an assembly flaw, substandard materials, contamination of a solar cell, and the always-present manufacturing variations. Though a panel may have been manufactured with flaws, it may well be serviceable for an extended time, though less than expected. Other causes are beyond the control of the manufacturer or installer. For example, some cells in a panel may be exposed to more or less sunlight than other cells due to partial shade, dirt or bird droppings in a localized area, temperature variations across a panel, and non-uniform aging of the diffusion regions from cell to cell.

The destructive effects of hot-spot heating may be circumvented through the use of a bypass diode. A bypass diode is connected in parallel, but with opposite polarity, to a solar cell. Under normal operation, each solar cell will be forward biased and therefore the bypass diode will be reverse biased and will effectively be an open circuit. However, if a solar cell is reverse biased due to a mismatch in short-circuit current between several series connected cells, then the bypass diode conducts, thereby allowing the current from the good solar cells to flow in the external circuit rather than forward biasing each good cell. The maximum reverse bias across the poor cell is reduced by the bypass diode to about a single diode drop, thus limiting the current and preventing hot-spot heating.

A typical circuit model of a solar panel is shown in FIG. 16. For clarity of explanation, the example is simply two cells in series. Obviously a typical panel has many more cells in series to form a "string", and some have multiple strings in parallel. In the model of FIG. 16, each solar cell is modeled as a current source in parallel with a reverse-biased diode. The example of FIG. 16 includes a cell 1602 in series with a cell 1604, with bypass diodes 1610, 1612 respectively. The current of the model arises from the photodiodes 1606, 1608 when exposed to adequate light. We consider four cases related to solar cells that are equal and unequal in power capacity, each case in open and short circuit configurations. In a short circuit condition and with matched cells the voltage across both the solar cells and the bypass diodes is zero; the bypass diodes have no effect. When open circuit (also with matched cells) the short current from each cell forward biases the cell. The bypass diodes are reverse biased, and again, have no effect on the circuit.

Assume now that cell 1604 is shaded, thus has less power providing capacity than that of cell 1602. For the short circuit condition, some current flows from cell 1602, forward biasing the cell 1602. The bypass diode 1610 is again reverse biased and has no effect. The voltage of the good cell 1602 forward biases the bypass diode 1612 of the weak cell 1604, causing it to conduct current. The shaded cell 1604 itself is reverse biased with approximately a diode drop of about −0.5 volts. For the fourth condition, that is a weak cell 1604 and an open circuit, the shaded cell 1604 has a reduced voltage. The bypass diodes 1610, 1612 are reverse biased and have no effect.

In practice, however, one bypass diode per solar cell is generally too expensive and instead bypass diodes are usually placed across groups of solar cells. The voltage across the shaded or low current solar cell is equal to the forward bias voltage of the other series cells which share the same bypass diode plus the voltage of the bypass diode. The voltage across the unshaded solar cells depends on the degree of shading on the low current cell. For example, if the cell is completely shaded, then the unshaded solar cells will be forward biased by their short circuit current and the voltage will be about 0.6V. If the poor cell is only partially shaded, the some of the current from the good cells can flow through the circuit, and the remainder is used to forward bias each solar cell junction, causing a lower forward bias voltage across each cell. The maximum power dissipation in the shaded cell is approximately equal to the generating capability of all cells in the group. The maximum group size per diode, without causing damage, is about 15 cells/bypass diode, for silicon cells. For a normal 36 cell module, therefore, 2 bypass diodes are used to ensure the module will not be vulnerable to "hot-spot" damage.

Consider now a typical solar panel configuration and response to partial shading. A set of 25 modules connected in series form a nominal Vmpp of 467.5 V at 11.23 A or 5,250 W. Assume each module is constructed of three strings of 38 cells (mpp @492 mV, 3.743 A) each and the top middle and bottom of each string are connected. Between the middle of top and middle to bottom are bypass diodes (Vf 410 mV). If one cell became shaded or soiled to the extent that it's current dropped by 374 mA or more (10%) then two candidate operating points would be found by an MPPT scan for the string:

Approximately 467.5V @10.853 A or 5,075 W or
Approximately 457.7V @11.230 A or 5,140 W Since the portion of the module with the shaded cell only produce 10.853 A, its bypass diode is forced into conduction forcing the bypass diode's 410 mV and the 9.350 V of the 19 bypassed cells to be subtracted from that modules voltage (total loss of 9.760V from the string of modules). Within the bypassed 19 cells the sum of the voltage across the good 18 cells plus the voltage across the shaded cell must equal −410 mV (the voltage across the bypass diode) at the current of the shaded cell (because all 19 cells are in series).

The solution is approximately 8.856V across the 18 good cells and −9.266V across the shaded cell @3.369 A or 31.2 w of power dissipation in the shaded cell. Note that a similar situation exists with the other two sets of 19 cells because they too are forced to sum to the −410 mV of the bypass diode.

The bypass diode has the difference of module string current minus the bypassed sections. The module is producing 97.026 W for a loss of 54% and dissipating an additional 100 was heat. A string monitoring means, for example an ADC, would record a 10V drop in nominal Vmp for the string. A technician dispatched to investigate would find a module operating at 9V when he expected 18V, no change in power when he cast a shadow across half of the module and that some cells in the module were abnormally hot (all standard trouble shooting observations). The technician may conclude that the module is below the 80% limit and assert that it has failed. However at the factory, this module would flash test as only 3.4% below nominal at 18.7V and 10.853 A or 203 w, although it would show a current step of 374 mA (3.3%) at about 8.940V.

The result of the reversal of one or more cells varies for differing solar cell technologies. For cells of a mono-crystalline type, there may be no lasting damage but a loss of efficiency. For cells of a thin-film construction, reversal of a voltage on a given cell is immediately catastrophic. As is seen, then, bypass diodes are a necessary and effective method for diminishing hot spots caused by partial shading or other causes for a weak cell. However, looking to FIG. 17, we see that the strings 1702, 1704, 1706, 1708, 1710, 1712 have an interconnect of conductors of a certain size which we will call size "X". If the bypass diodes 1712, 1722 conduct, they can carry as much as 3× the current of one of the strings, therefore the conductor for each bypass diode is normally sized as 3× that of a single string conductor. The size of the bypass diode interconnect 1730, 1732 then, adds significant area to the minimum area for constructing a solar panel.

What is needed is a means for avoiding hot spots without bypass diodes and their attendant area increase of a solar panel.

SUMMARY

The present invention avoids the condition of a hot spot without the use of an efficiency-lowering protection diode. The method of the present invention assumes an apparatus is used to control the operating conditions of the panel, wherein the apparatus includes means for measuring the total voltage across the strings and means for changing the operating conditions of the panel. Bypass diodes are not needed nor used, saving the area required for interconnect as typical with the prior art. In the present invention, the instant voltage is compared to the expected voltage for a measured operating temperature. If the voltage is less than expected by more than a certain amount, the power (current) demanded from the panel is reduced such that the voltage is less than a diode drop of the expected voltage, thereby avoiding a hot spot. With hot spots, that is reverse biasing of a weak cell, avoided, bypass diodes are not needed.

DETAILED DESCRIPTION OF THE INVENTION

Figure 1:
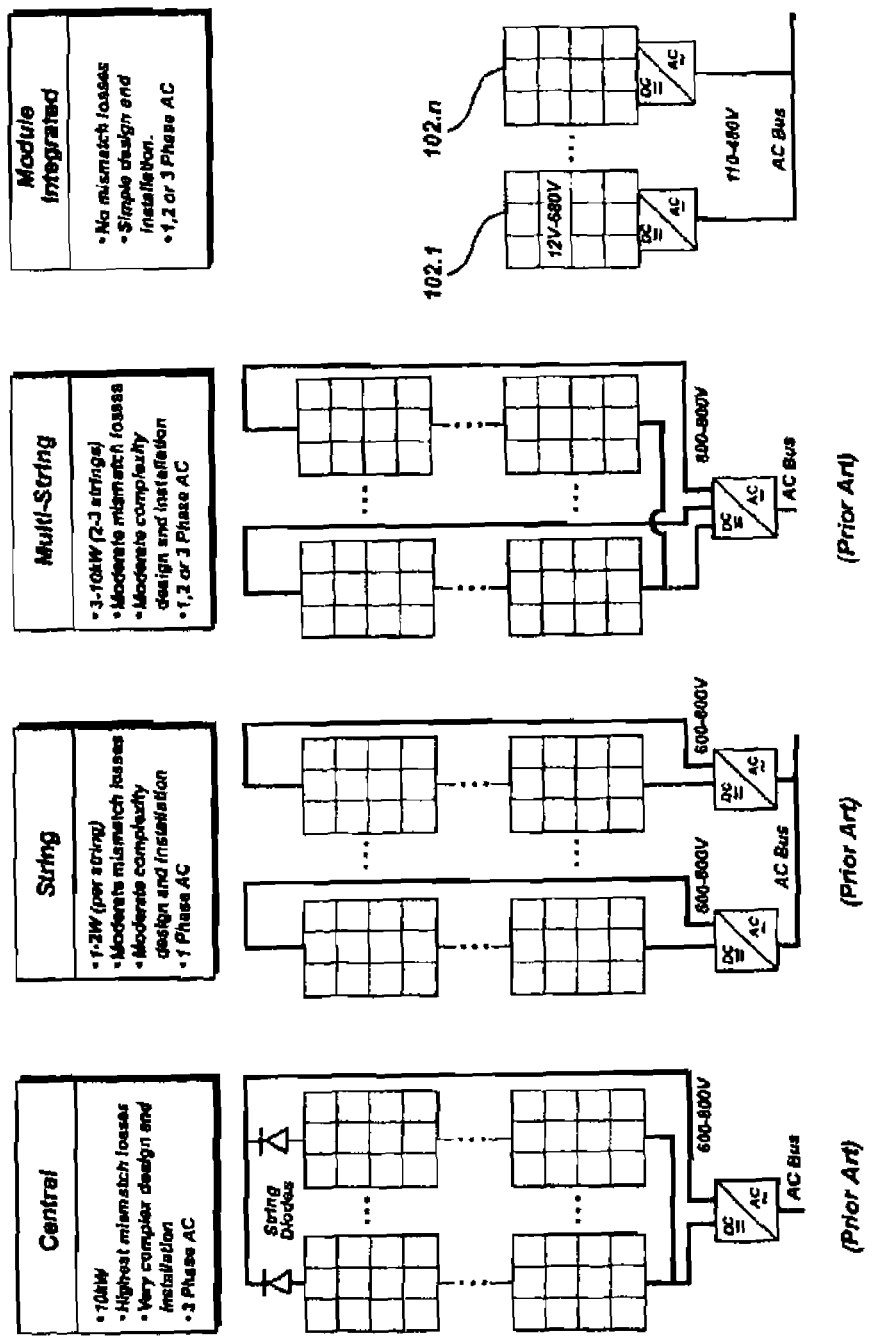
FIG. 1 shows examples of the prior art and a brief example of the present invention.
Figure 2:
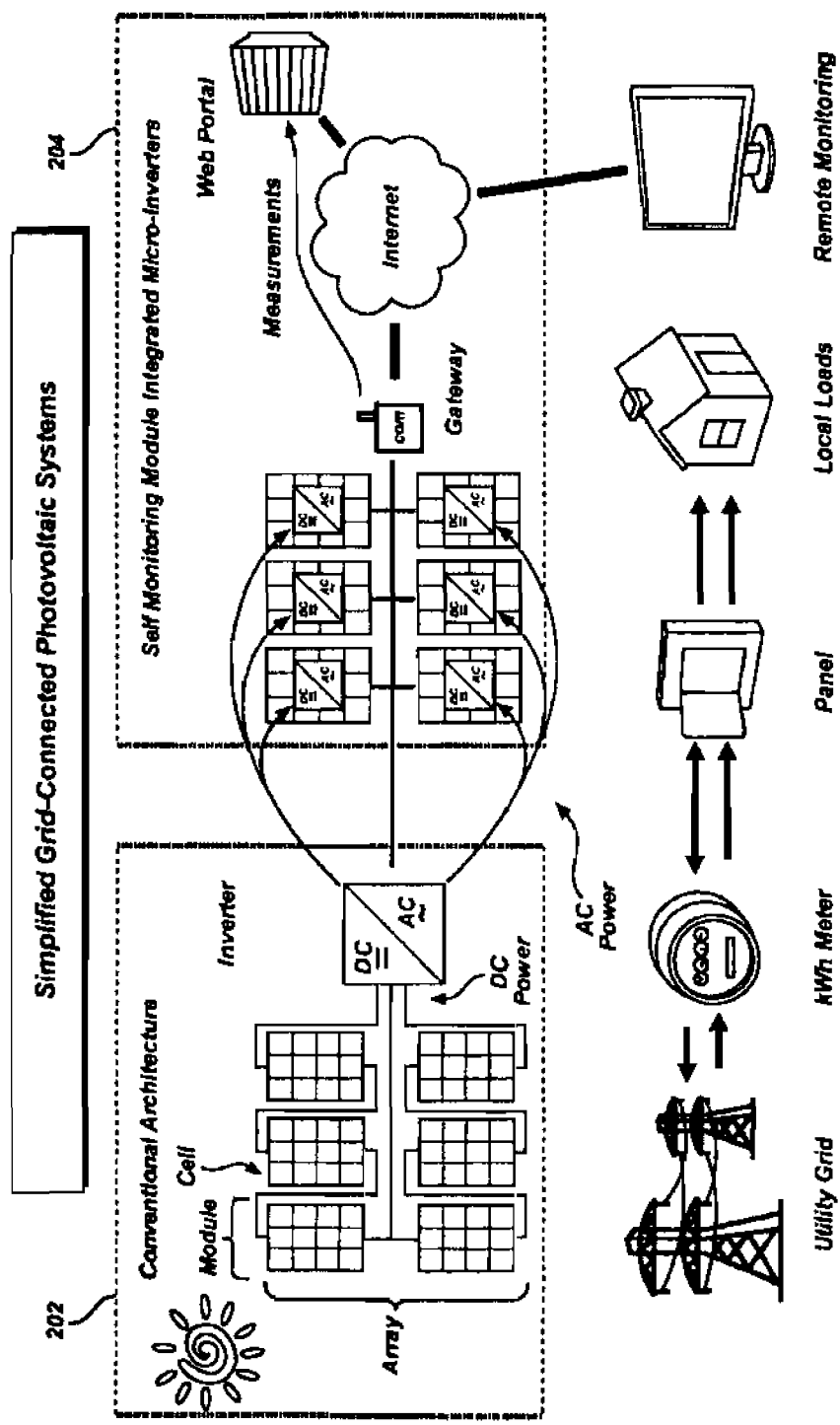
FIG. 2 is an example of grid-connected photovoltaic systems.
Figure 3:
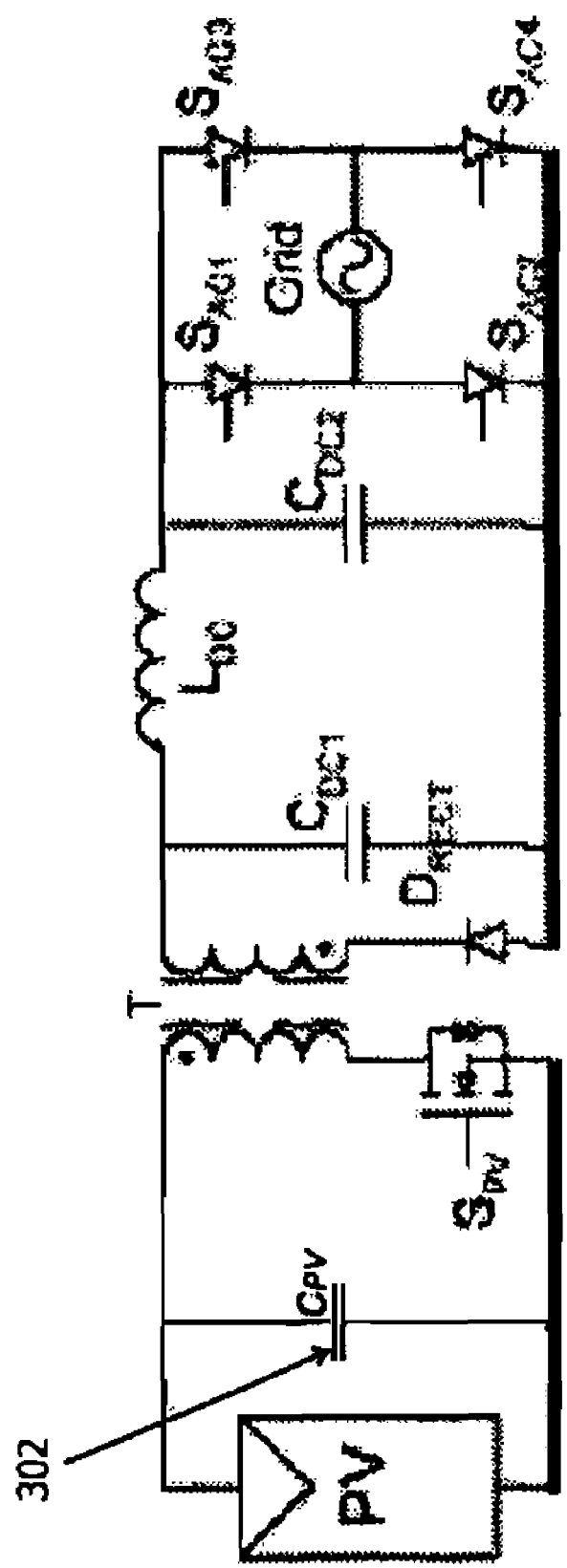
FIG. 3 is an example of the current art. PRIOR ART.

| | |
|---|---|
| Grid | AC power provided to a premises by an outside source, typically a utility company. |
| PV | Photovoltaic panel; another term for the commonly-used "solar panel" |
| cps | Abbreviation for "cycles per second"; the frequency of an AC power supply |
| AC | Abbreviation for "alternating current", though one may also view it as "alternating voltage" in that the polarity of the voltage provided alternates. |
| DC | Abbreviation for "direct current"; electrical power that is always provided in a given polarity. The voltage of the power source may or may not be fixed. |
| FET | Field effect transistor |
| PAM | Pulse Amplitude Modulation. a form of signal modulation where the message information is encoded in the amplitude of a series of signal pulses. |
| PCM | Pulse Code Modulation. a digital representation of an analog signal where the magnitude of the signal is sampled regularly at uniform intervals, then quantized to a series of symbols in a digital (usually binary) code. |
| MPPT | Maximum Power Point; a condition wherein a power source is operated at its maximum power output condition. In solar panels, controlling devices may frequently try differing operating conditions to determine the maximum power point for the instant conditions. |
| Array Converter | An electronic module for controlling the operation of a solar panel, disclosed in more detail in the U.S. patent application Ser. No. 12/061,025. |

According to the present invention, a DC to pulse amplitude modulated ("PAM") current converter, denominated a "PAMCC" is connected to an individual solar panel ("PV"). A solar panel typically is comprised of a plurality, commonly seventy-two, individual solar cells connected in series, wherein each cell provides approximately 0.5 volt at some current, the current being a function of the intensity of light flux impinging upon the panel. The PAMCC receives direct current ("DC") from a PV and provides pulse amplitude modulated current at its output. The pulse amplitude modulated current pulses are typically discontinuous or close to discontinuous with each pulse going from near zero current to the modulated current and returning to near zero between each pulse. The pulses are produced at a high frequency relative to the signal modulated on a sequence of pulses. The signal modulated onto a sequence of pulses may represent portions of a lower frequency sine wave or other lower frequency waveform, including DC. When the PAMCC's output is connected in parallel with the outputs of similar PAMCCs an array of PAMCCs is formed, wherein the output pulses of the PAMCCs are out of phase with respect to each other. An array of PAMCCs constructed in accordance with the present invention form a distributed multiphase inverter whose combined output is the demodulated sum of the current pulse amplitude modulated by each PAMCC. If the signal modulated onto the series of discontinuous or near discontinuous pulses produced by each PAMCC was an AC current sine wave, then a demodulated, continuous AC current waveform is produced by the array of PAMCCs. This AC current waveform is suitable for use by both the "load", meaning the premises that is powered or partially power by the system, and suitable for connection to a grid. For example, in some embodiments an array of a plurality of PV-plus-PAMCC modules are connected together to nominally provide split-phase, Edison system 60 cps 240 volt AC to a home.

Before discussing an array comprising a plurality of PV-plus-PAMCC modules, we first look at an individual PAMCC. For example, referring to FIG. 4, a PV panel is electronically represented by the diodes and capacitor shown as reference numeral 401. Collectively the components comprising an PAMCC (or sometimes "micro inverter") are referred to as simply "the PAMCC 400." Current is provided by the PV 401 to a positive input terminal 402 and a negative input terminal 403. The positive input terminal 402 is connected in series with a coil L 1 406. The negative input terminal 403 is connected in series with a coil L 2 405. In one embodiment coils L 1 406 and L 2 405 form a one-to-one transformer with two input and two output terminals. Such an embodiment provides better current matching through the two current paths. Hereinafter we refer to the single transformer as "T 1" 407. A switch Q 1 404, for example an NMOS FET, is connected across the load side of the transformer 407, with the source of Q 1 404 connected in parallel to the negative terminal of the T 1 407 output. Note that the negative sides of the PV 401 and of the PAMCC 400 are floating; that is, they are not grounded. A controller 412 has an output terminal 414 which provides a signal to the control gate (Q 1 G) of Q 1 404 on a line 411. In some embodiments the controller 412 is a microprocessor with additional logic and is operated by a program. The controller 412 is discussed in more detail hereinafter.

The controller 412 comprises a plurality of output terminals, each operated independently. Four controller 412 output terminals 415 through 418 are connected to the control terminals of four SCRs (CR 11 424; CR 22 423; CR 12 425; and CR 21 426 respectively) by four lines 119 through 422 respectively (inner-connections not shown). Each line, therefore each SCR, is independently controlled by control signals from the controller 412. The anode terminals of CR 11 424 and CR 22 423 are connected in parallel to the positive output terminal of T 1 407. The cathode terminals of SCRs CR 12 425 and CR 21 426 are connected in parallel to the negative output terminal of T 1 407. The cathode terminal of SCR CR 11 424 and the anode terminal of SCR CR 12 425 are connected in parallel to a coil L 12 430. The cathode terminal of SCR CR 22 423 and the anode terminal of SCR CR 21 426 are connected in parallel to a coil L 22 431. A terminal 434 from coil L 12 430 is arbitrarily designated as providing a "phase 1" (P 1) output and a terminal 436 from coil L 22 431 is arbitrarily designated as providing a "phase 2" (P 2) output. In some embodiments the coils L 12 430 and L 22 431 are embodied in a one-to-one transformer. In the embodiment exemplified in FIG. 4 coils L 12 430 and L 22 136 are separate coils. A capacitor C 12 438 is across the input side of coil L 12 430 and a neutral output terminal 432. Another capacitor C 22 is across the input side of coil L 22 431 and the neutral output terminal 432. In another embodiment there is no neutral output terminal 432 and there is a single capacitor across the input terminals of coil L 12 430 and L 22431; in this embodiment the voltage rating of the capacitor is at least twice that of capacitors C 22 440 and C 12 438.

The method of the invention is implemented by control signals on lines 411 and 419 through 422. In particular the control signal Q 1 G on line 411 and signals CR 11 T on line 419; CR 22 T on line 420; CR 12 T on line 421; and CR 21 T on line 422 connect and disconnect the current provided by PV 401 in a sequence within the PAMCC 400 with a high-frequency period, for example 30 KHz, which provides a PCM signal which is modulated by a slower, 60 cycle pattern, thereby providing an output whose amplitude is a PAM signal approximating a sine wave.

Figure 4:
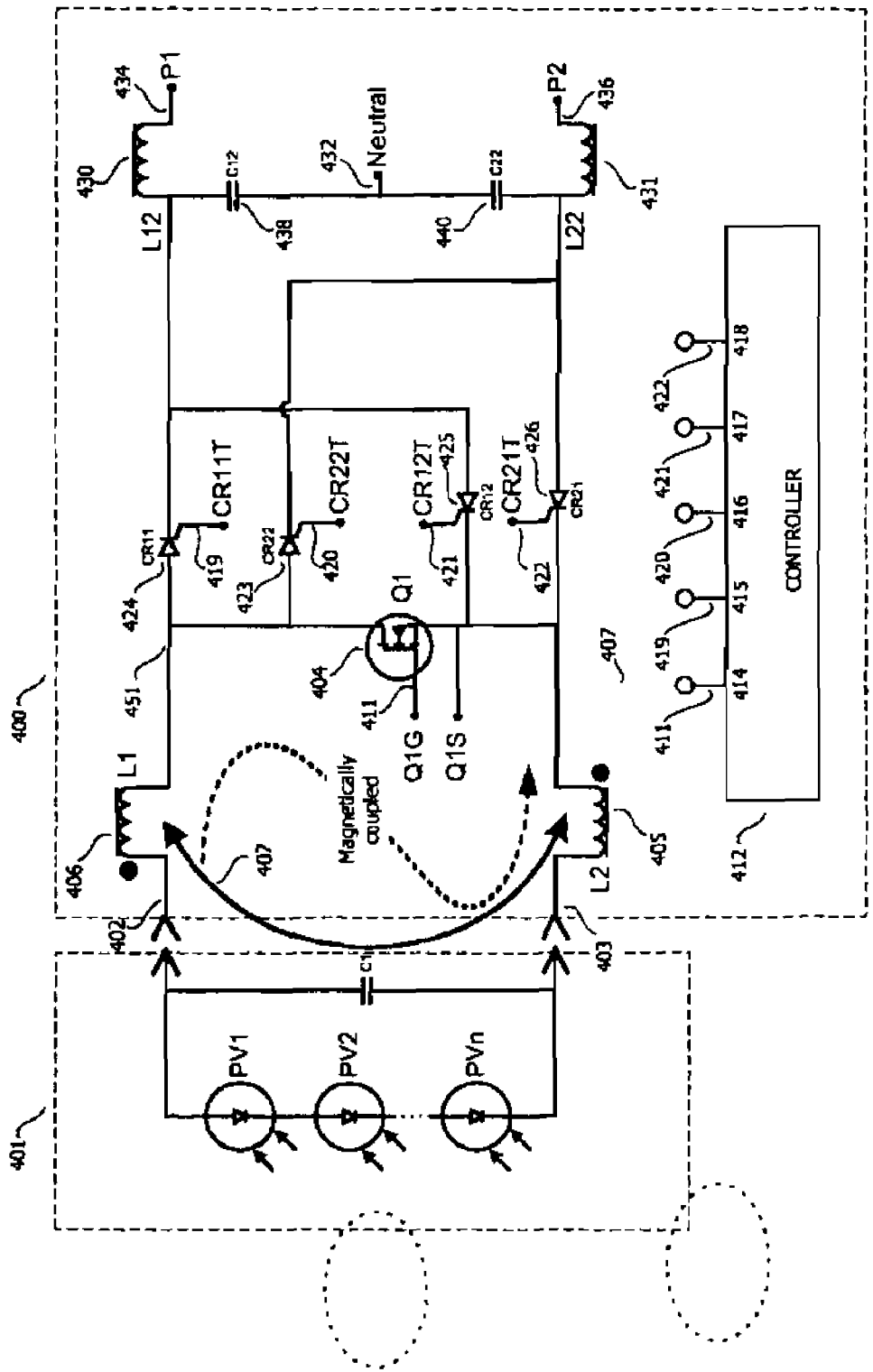
FIG. 4 is an example of a single pulse amplitude modulated current converter according to the present invention.

Referring to FIG. 4, the initial conditions are as follows: Q 1 404, CR 11 424, CR 22 423, CR 12 425 and CR 21 426 de-energized; coils L 1 406, L 2 405, L 12 430 and L 22 431 empty of current; and photovoltaic cells PV 1 through PVn dark. In this condition the grid AC voltage is applied between P 1 434 and P 2 436 and experiences a path through L 12 430, C 12 438, C 22 440 and L 22 431. The resonant frequency selected for a reconstruction filter comprising L 12 430 and C 12 438 is typically chosen to be about one half the switching frequency of Q 1 404. The resonant frequency of a reconstruction filter comprising L 22 431 and C 22 440 is chosen to be the same as the reconstruction filter of L 12 430 and C 12 438. In one embodiment the transistor Q 1 404 is selected for a specified switching frequency of approximately 30 kHz and the resonant frequency of the reconstruction filters are then designed for 15 kHz. With the grid AC voltage typically being 60 Hz, an unimportant amount of capacitive reactive load is presented to the grid.

Circuit operation begins with the solar panel 401 being exposed to sufficient light to produce significant current. The presence of the current may be observed as an increase in voltage across Q 1 404. At this point Q 1 404 is initially turned on by applying a signal from controller 412 on line 411 between Q 1 G and Q 1 S. The interface between the controller 412 and the transistor Q 1 404 may be optically isolated, transformer coupled, or the controller 412 may be connected to Q 1 S. In this state L 1 406 and L 2 405 begin to charge with current. When the voltage across PV 401 falls to a predetermined value, the time to charge the coils is noted in order to calculate the current and standard operation begins with the next grid zero crossing. In one embodiment this is when the voltage at P 1 crosses above P 2 while P 1 is going positive and P 2 is going negative. At this point signals CR 11 T 419 and CR 21 T 421 are asserted such that CR 11 424 and CR 21 426 will conduct when current are applied to them.

Case 1: PWM Modulation for Positive Half Wave of the Grid

Figure 5:
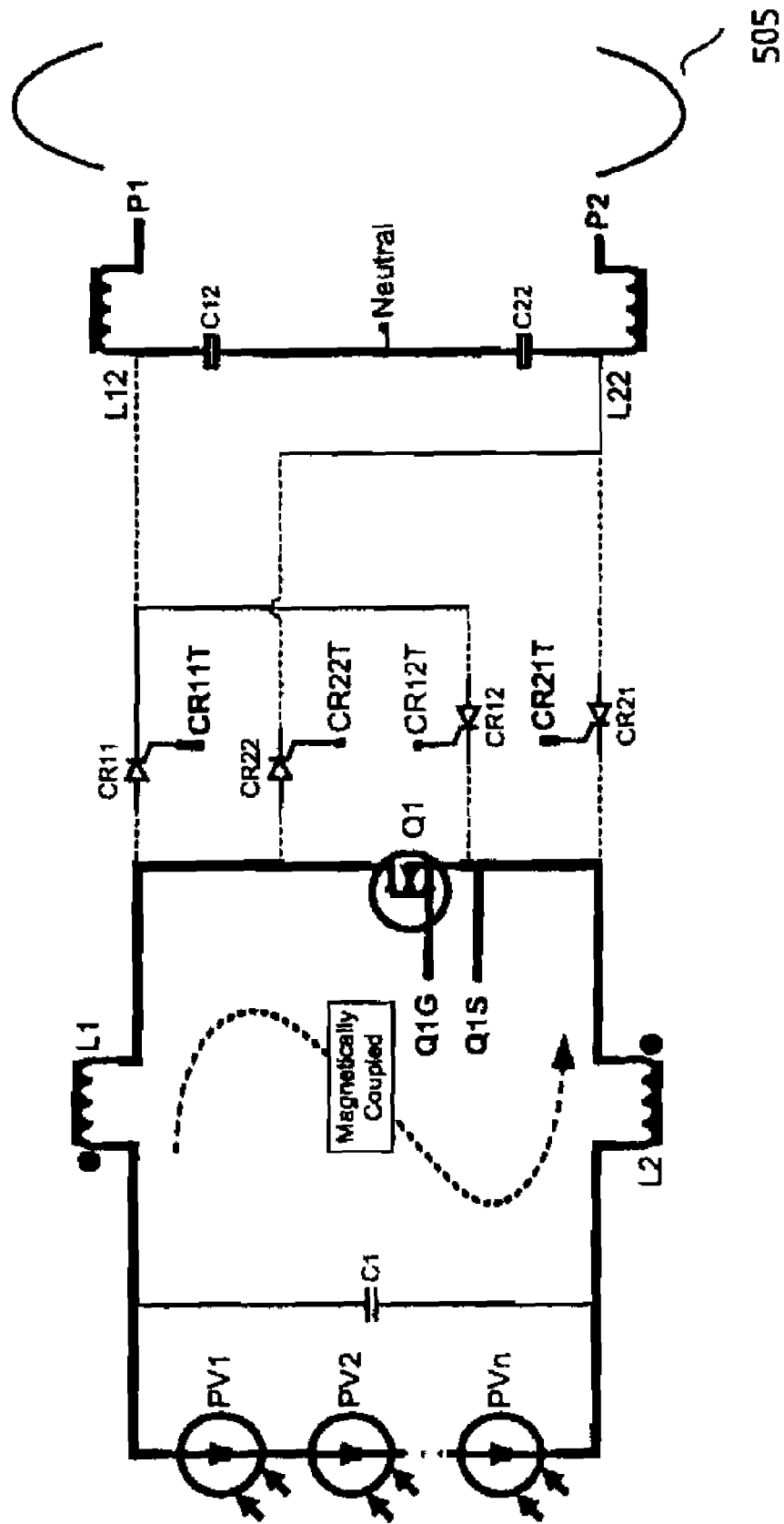
FIG. 5 shows a pulse amplitude modulated current converter with a transistor completing the circuit to charge inductors while reconstruction filters produce current pulses for the grid positive half phase.

FIG. 5 through FIG. 8 will be referred to in describing the operation of PAMCC 400. Note that the components correspond to those of FIG. 4, but the reference numbers have been left off so as not to obscure the description. However we refer to the reference numbers provided by FIG. 4. Looking to FIG. 5, with L 1 406 and L 2 405 charged, Q 1 404 is turned off for a pulse width modulated time. After the off time has expired, Q 1 404 is turned on until the end of the current switching cycle. During the time that Q 1 404 is off, current previously stored in L 1 406 and L 2 405, together with the current flowing in PV 401, is applied to the input terminals of CR 11 424 and CR 21 426, which remain enabled as a result of the signals CR 11 T 419 and CR 21 T 421 for the entire positive half cycle of the grid. The positive half cycle of the grid is defined as the condition wherein the voltage at output terminal P 1 434 is greater than the voltage at output terminal P 2 436. The charge in the current pulse delivered through the SCR CR 11 424 is initially stored on capacitor C 12 438, creating a voltage more positive on the near end of coil L 12 430 relative to the end of coil L 12 which is connected to the output terminal P 1 434. The charge in the current pulse delivered through SCR CR 21 426 is initially stored on capacitor C 22 440, a voltage more negative on the near end of coil L 22 431 relative to the end of coil L 22 which is connected to the output terminal P 2 436. This is the initial condition for both the reconstruction filter comprising L 12 430, C 12 438 and the reconstruction filter comprising L 22 431, C 22 440. At this point the reconstruction filters will transform the pulse width modulated current pulse delivered to them to a pulse amplitude modulated (PAM) half sine wave of current 505 delivered to the grid as shown in FIG. 5.

The resonant frequency for the reconstruction filters are chosen to be about one half the switching frequency of Q 1 404 so that one half of a sine wave of current will be provided to P 1 434 and P 2 436 for each pulse width modulated current pulse delivered to them. Since the resonant frequency of each reconstruction filter is independent of the pulse width of current applied to it, and the charge in the instant current pulse applied to the reconstruction filter must be equal to the charge in the half sine wave of current delivered out of the reconstruction filter to the grid, changes in the pulse width of input current will be reflected as changes in the amplitude of the output of the reconstruction filters. As the current in the inductors in the reconstruction filters returns to zero, the next pulse of current is delivered to the capacitors of the reconstruction filters because the frequency of the reconstruction filters is one half the rate at which pulse width modulated current pulses are produced by Q 1 404.

The off time of Q 1 404 is modulated such that the width of current pulses produced is in the shape of the grid sine wave. The reconstruction filters transform this sequence of pulse width modulated current pulses into a sequence of pulse amplitude modulated current pulses whose amplitude follows corresponding points of the shape of the grid sine wave.

So long as the grid half cycle remains positive at the terminal P 1 434 relative to the output of terminal P 2 436, further current pulses are produced by repeating the process described hereinbefore, beginning at "CASE 1: PWM modulation for positive half wave of the grid".

The negative zero crossing of the grid voltage is defined as the condition wherein the voltage at terminal P 1 434 is equal to the voltage at terminal P 2 436 after P 1 434 has been more positive than P 2 436. Prior to the negative zero crossing, Q 1 404 is turned on, thereby removing current from CR 11 424 and CR 21 426. At this point the signals CR 11 T 419 and CR 21 T 421 are de-asserted, preventing SCRs CR 11 424 and CR 21 426 from conducting current during the grid negative half cycle. After the negative zero crossing, with the voltage of terminal P 1 434 more negative than the voltage of terminal P 2 436, the signals CR 22 T 420 and CR 12 T 421 are then asserted, enabling CR 22 423 and CR 12 425 to conduct when current is applied to them.

CASE 2: PWM Modulation for Negative Half Wave of Grid

Figure 6:
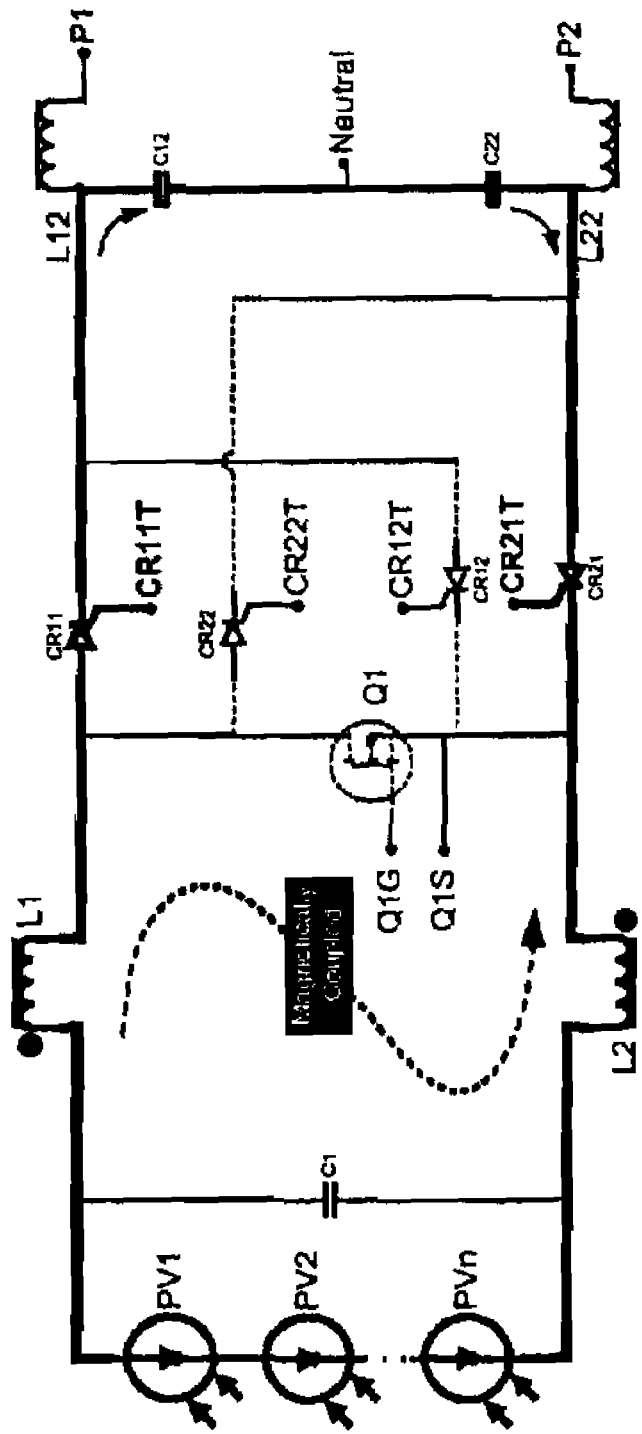
FIG. 6 shows a pulse amplitude modulated current converter with current flowing through into the reconstruction filters for the grid positive half phase.
Figure 7:
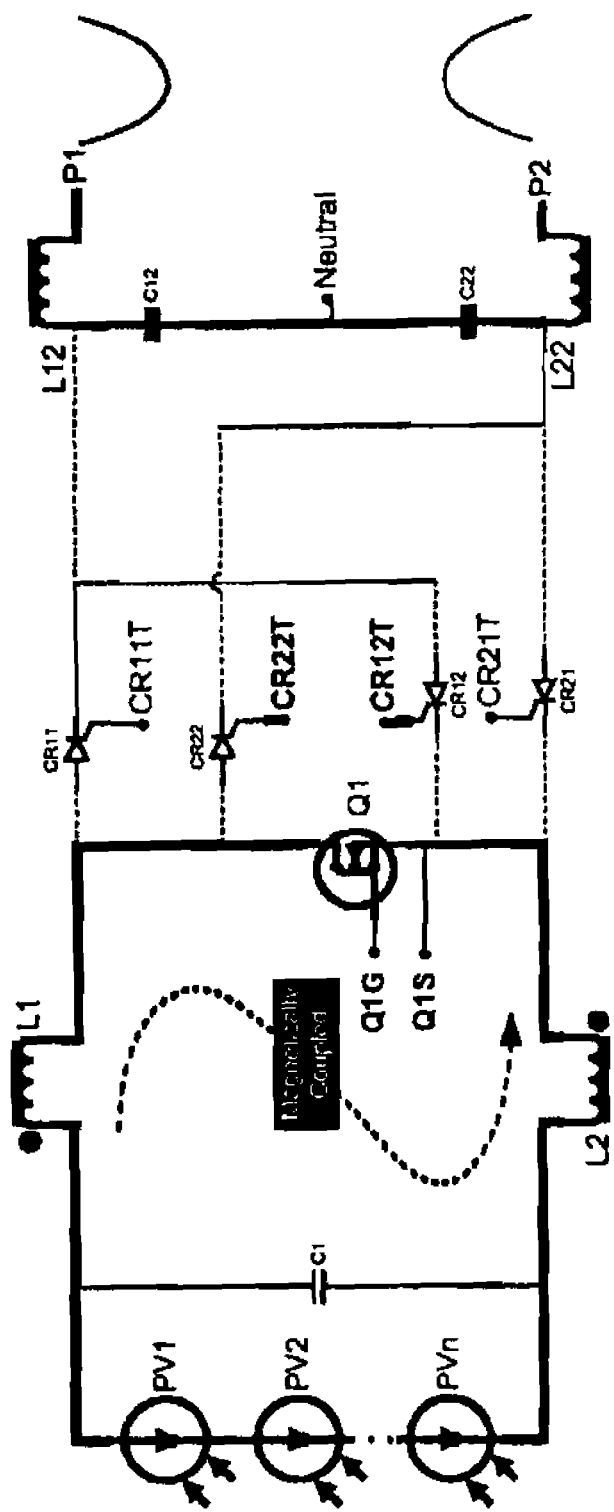
FIG. 7 shows a pulse amplitude modulated current converter with a transistor completing the circuit to charge inductors while reconstruction filters produce current pulses for the grid negative half phase.
Figure 8:
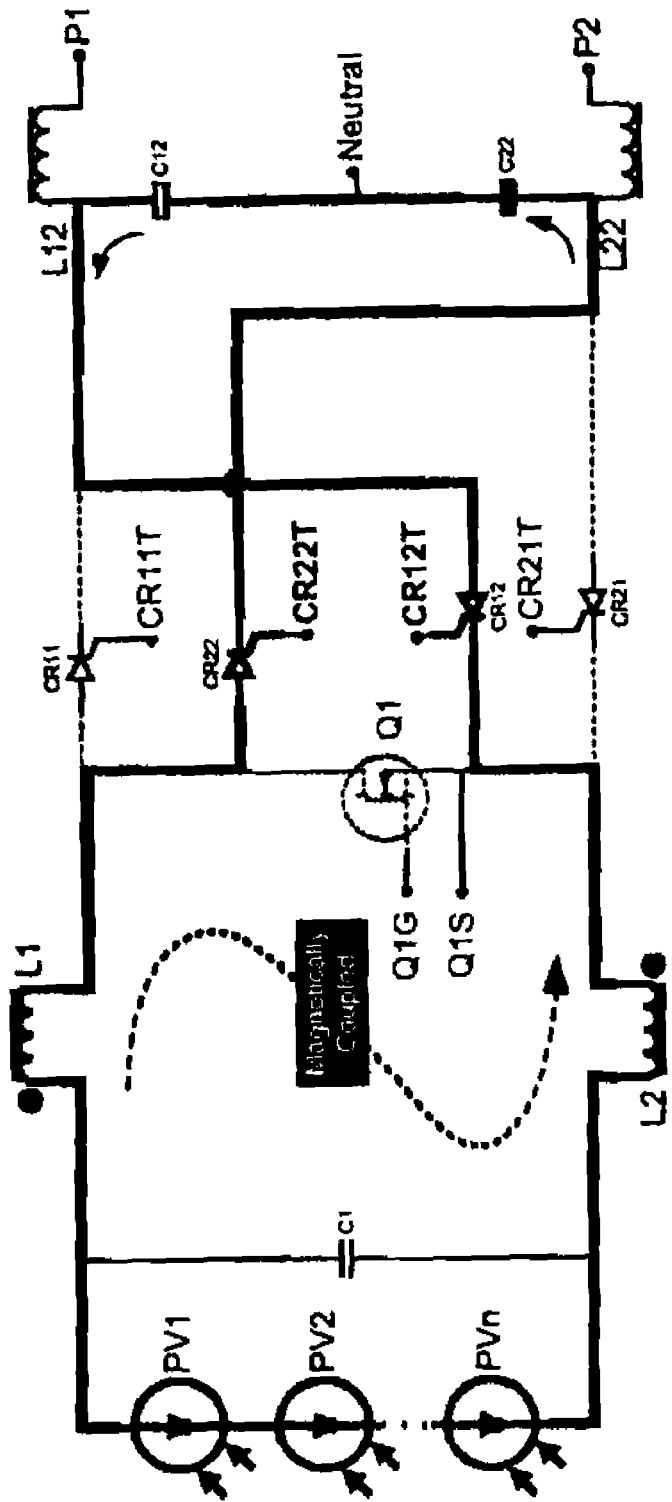
FIG. 8 shows a pulse amplitude modulated current converter with current flowing through into the reconstruction filters for the grid negative half phase.

Referring to FIG. 6, with L 1 406 and L 2 405 charged Q 1, 404 is turned off for a pulse width modulated time. After the off time has expired, Q 1 404 is turned on until the end of the instant current switching cycle. During the time that Q 1 404 is off, current previously stored in L 1 406 and L 2 405 together with the current flowing in PV 401 is applied to the input terminals of CR 12 425 and CR 22 423 which remain enabled by signals CR 22 T 420 and CR 12 T 421 for the entire negative half cycle of the grid. The negative half cycle of the grid is defined as the condition wherein the voltage at terminal P 1 434 is less than the voltage at terminal P 2 436. The charge in the current pulse delivered through the SCR CR 22 423 is initially stored on capacitor C 22 440, creating a voltage more positive on the near end of coil L 22 431 relative to the end connected to terminal P 2 436. The charge in the current pulse delivered through CR 12 425 is initially stored on C 12, a voltage more positive on the near end of coil L 12 430 relative to the end connected to terminal P 1 434. This is the initial condition for both reconstruction filter comprising L 12 430, C 12 438 and reconstruction filter comprising L 22 431, C 22 440. At this point the reconstruction filters will transform the pulse width modulated current pulse delivered to them to a pulse amplitude modulated half sine wave of current delivered to the grid as shown in FIG. 6.

The reconstruction filters for Case 2 are the same components as described in association with Case 1; their design and operation are not repeated here.

The off time of Q 1 404 is modulated such that the width of current pulses produced is in the shape of the grid sine wave. The reconstruction filters transform this sequence of pulse width modulated current pulses into a sequence of pulse amplitude modulated current pulses whose amplitude follow corresponding points of the shape of the grid sine wave.

So long as the grid half cycle remains negative, with the voltage of terminal P 1 434 more negative than the voltage of terminal P 2 436, further current pulses are produced by repeating the process described hereinbefore, beginning at "CASE 2: PWM modulation for negative half wave of grid."

The positive zero crossing of the grid voltage is defined as the condition wherein the voltage at terminal P 1 434 is equal to P 2 436 after the voltage at terminal P 1 434 has been more negative than the voltage of terminal P 2 436. Prior to the positive zero crossing, Q 1 404 is turned on, removing current from SCRs CR 12 425 and CR 22 423. At this point the signals CR 12 T 421 and CR 22 T 420 are de-asserted, preventing SCRs CR 12 425 and CR 22 423 from conducting current during the grid positive half cycle. After the positive zero crossing with P 1 434 more positive than P 2 436, signals CR 11 T 419 and CR 21 T 421 are asserted, enabling SCRs CR 11 424 and CR 21 426 to conduct when current is applied to them.

The positive zero crossing of the grid voltage is defined as the condition wherein the voltage at terminal P 1 434 is equal to P 2 436 after the voltage at terminal P 1 434 has been more negative than the voltage of terminal P 2 436. Prior to the positive zero crossing, Q 1 404 is turned on, removing current from SCRs CR 12 425 and CR 22 423. At this point the signals CR 12 T 421 and CR 22 T 420 are de-asserted, preventing SCRs CR 12 425 and CR 22 423 from conducting current during the grid positive half cycle. After the positive zero crossing with P 1 434 more positive than P 2 436, signals CR 11 T 419 and CR 21 T 421 are asserted, enabling SCRs CR 11 424 and CR 21 426 to conduct when current is applied to them.

With the grid again positive, the process would again return to the process described hereinbefore, beginning with the section labeled CASE 1: PWM modulation for positive half wave of the grid.

Figure 9:
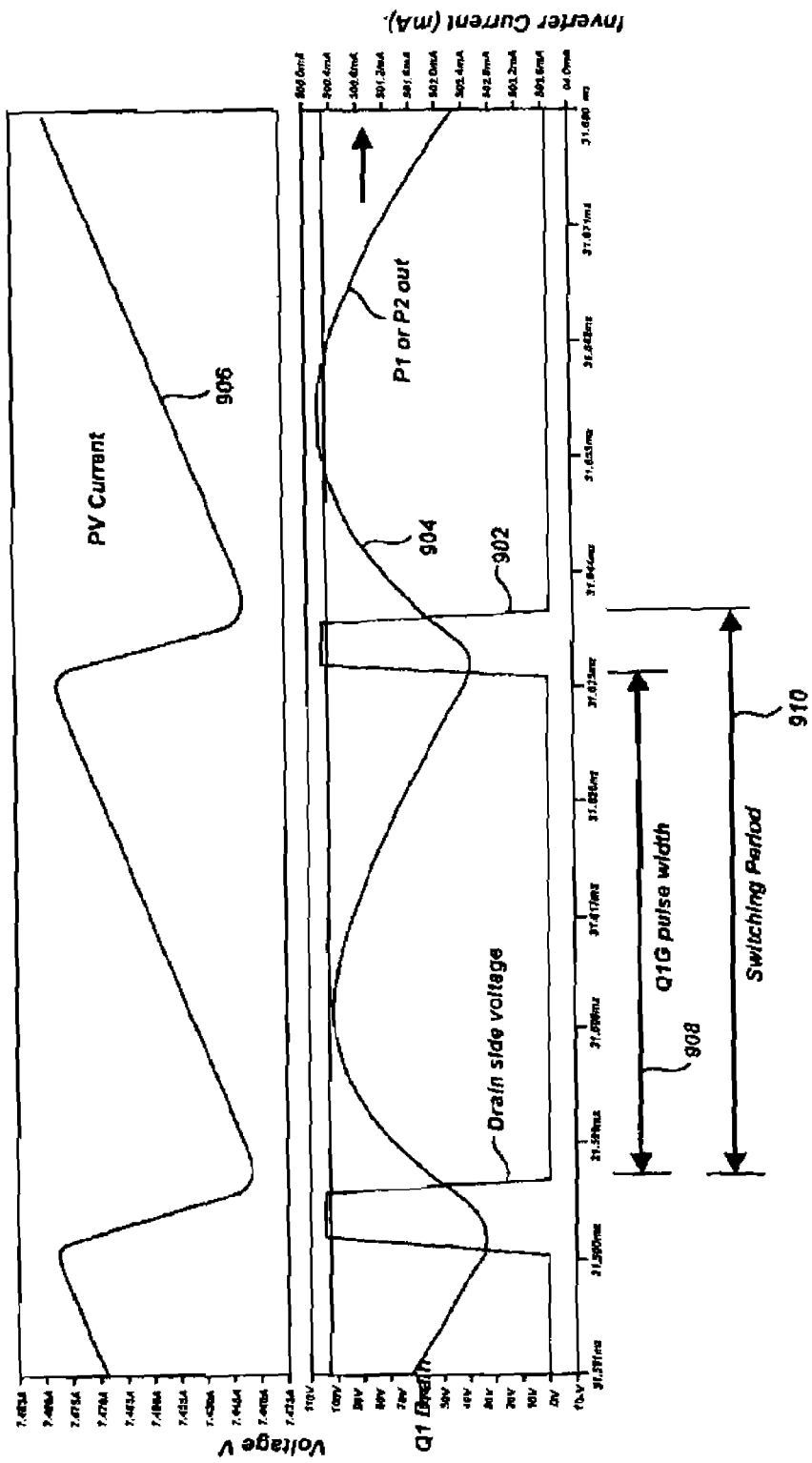
FIG. 9 relates the timing of drive signals and current.

FIG. 9 shows a signal diagram of the results of the conversion of a pulse width modulated pulse, translated into a pulse amplitude modulated (PAM) current pulse by a reconstruction filter, such as those previously disclosed hereinbefore (L 12 430 and C 12 438; L 22 431 and C 22 440). The short duration roughly rectangular voltage pulses 902 are the voltage on the drain side 451 (FIG. 4) of Q 1 404. The pulse width labeled 908 approximates the pulse width of the signal Q 1 G on line 411 (FIG. 4) and the period 910 is the switching period of the PAMCC 400. This voltage drives the transformer 407 and PV 401 currents through a SCR CR 11 424 or CR 12 425 (depending upon the instant status of the control signals from controller 412, as previously described) into the input of one of the reconstruction filters. The rounded half wave rectified sine wave 904 is the output of the reconstruction filter. As the pulse width 908 (approximately) of the input pulse increases, the amplitude of the output wave form 904 increases. The triangular wave form 906 at the top of the graphs plots the variation of current through PV 401 during the common window of time. Trace 906 shows the effect of transformer 407 in maintaining a relatively constant PV 401 current, independent of the relatively large pulse width modulated current pulses provided to the reconstruction filters.

Figure 10:
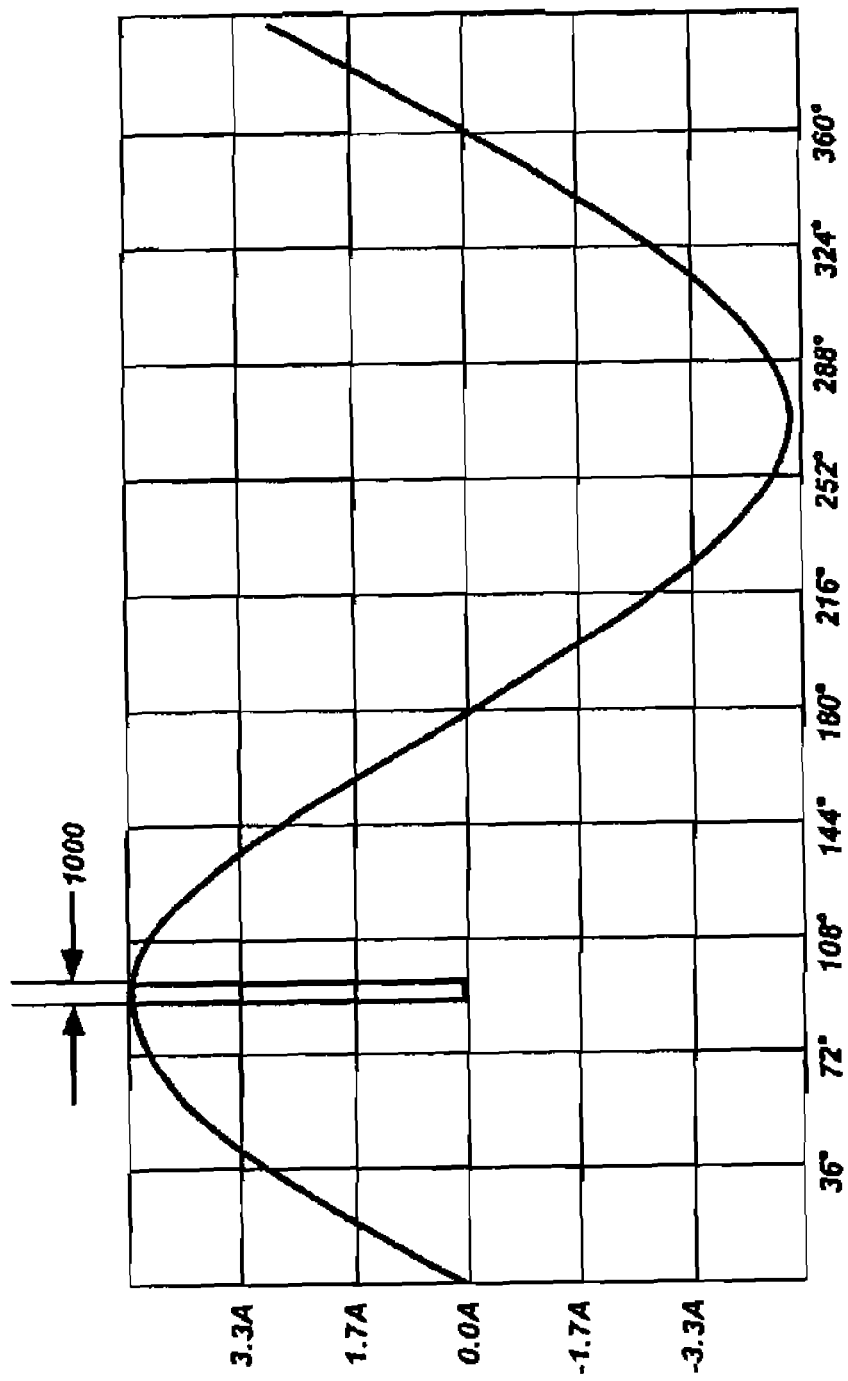
FIG. 10 shows what portion of current in a sine wave of current will be examined in detail in some following drawings.
Figure 11:
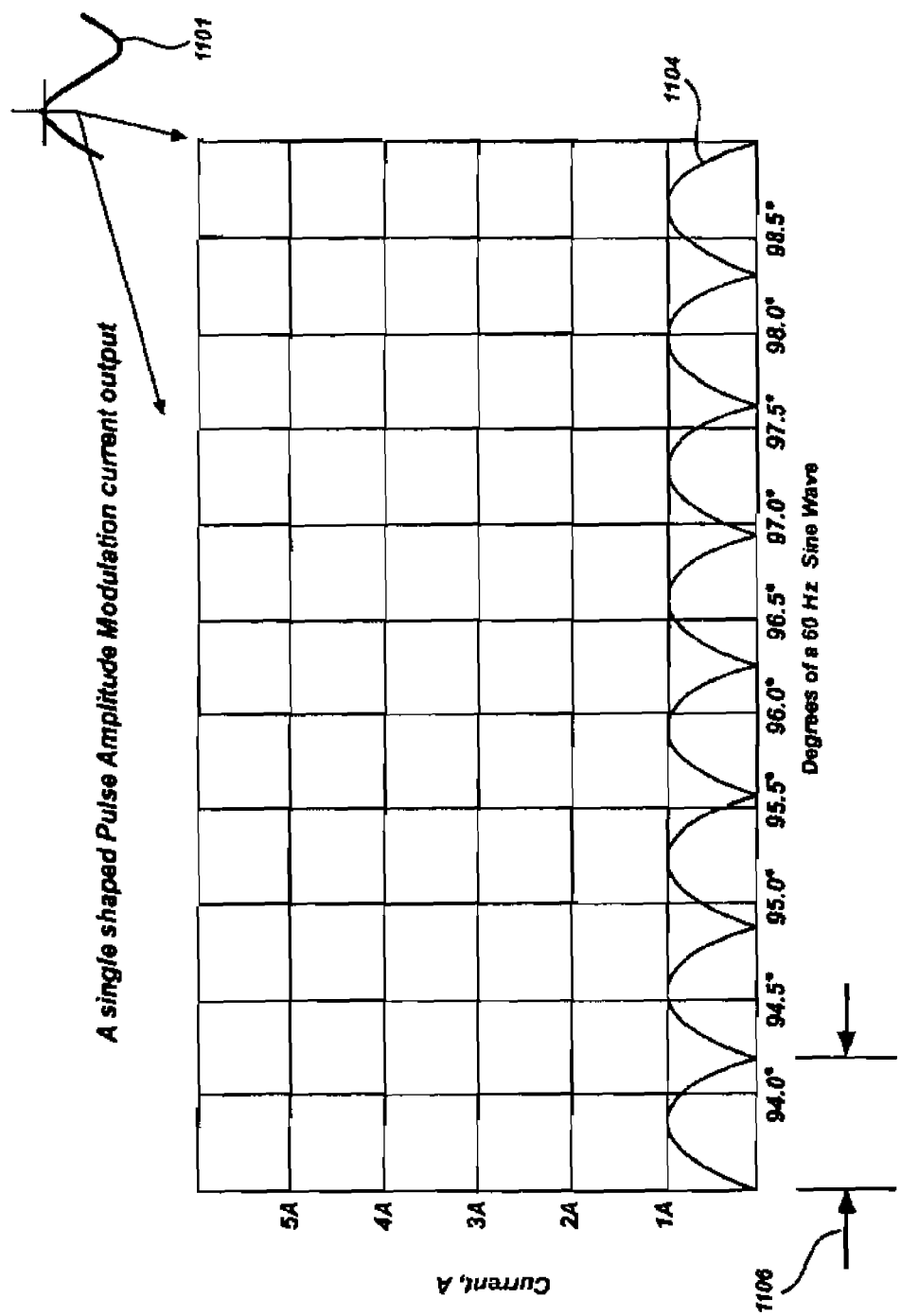
FIG. 11 shows the pulses provided by a single pulse amplitude modulated current converter.
Figure 12:
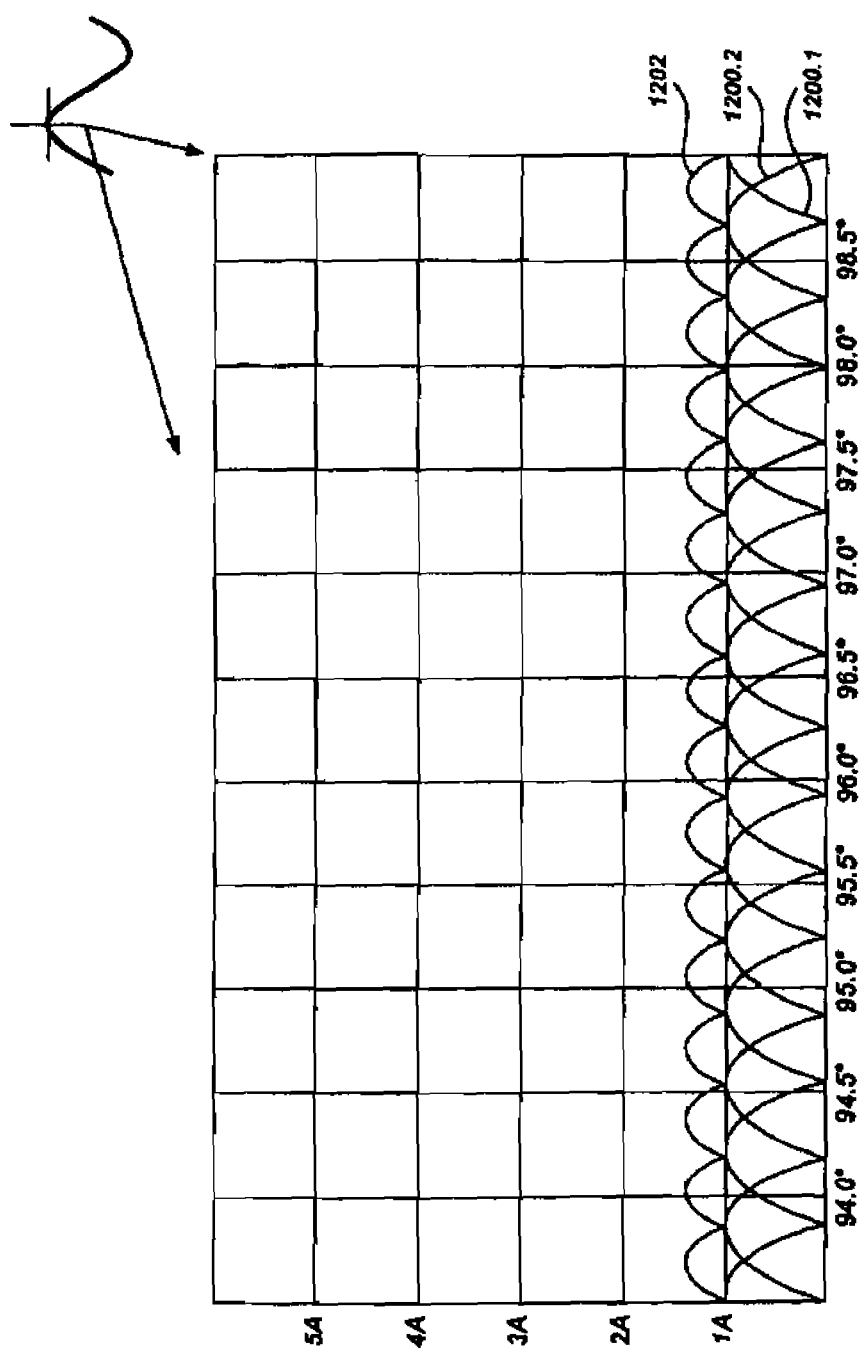
FIG. 12 shows the pulses provided by two pulse amplitude modulated current converters and their total, summed current.
Figure 13:
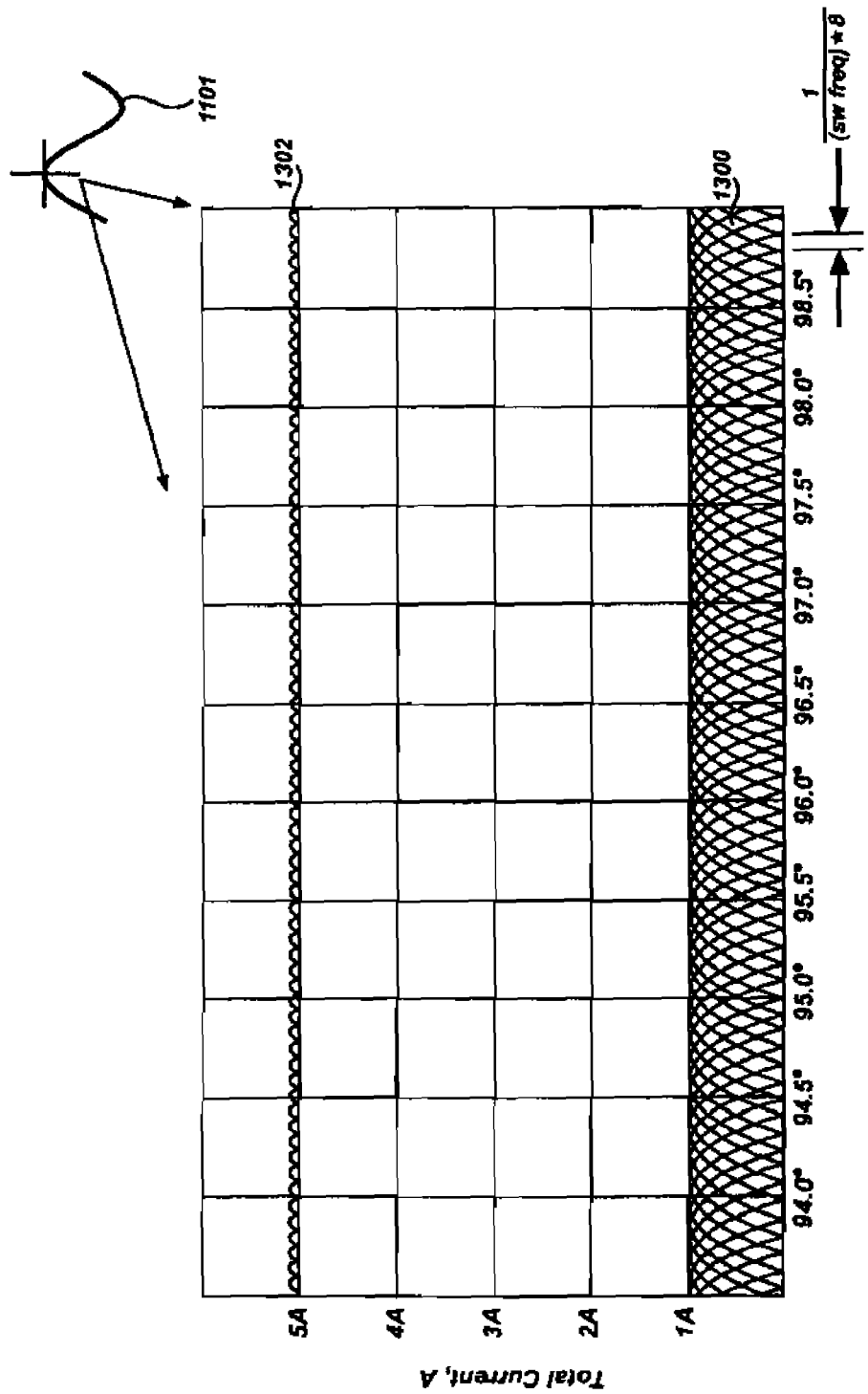
FIG. 13 shows the pulses provided by eight pulse amplitude modulated current converters and their total, summed current.

FIG. 10 indicates the narrow time slice of a grid sine wave cycle to be depicted in FIGS. 11, 12 and 13.

FIG. 11 shows the pulse amplitude modulated output current of a single PAMCC 400. Note that the amplitude shown is for a small portion of time near the positive peak of the grid voltage as indicated on the cycle example 1101. The individual pulses 1104 have a period 1106 equal to the period of the switching frequency, for example (1/30 KHz).

In FIG. 12, two individual currents (1200.1 and 1200.2) of two PAMCCs (each in accordance with the PAMCC 400) are phased apart one half of the period of the switching frequency. The trace 1202 above is the sum of the two PAMCC output currents 1200.1 and 1200.2. Note that the summed current 1202 has a much smaller ripple than the ripple of a single PAMCC (see FIG. 11) and has twice the ripple frequency as of the ripple frequency of a single inverter. The summed current 1202 does not return to zero.

Following on the summation of the currents of two PAMCC 400 outputs, FIG. 13 shows the individual output currents of eight PAMCCs (the line 1300 is representative; each waveform is not numbered), each phased evenly across the period of the switching frequency. For example for a system using a 30 KHz switching frequency, the period is 33.3 microseconds and each phase is delayed by (33.3/8), or 4.167 microseconds, relative to the previous output current waveform. Any number of PAMCCs 400 may be so summed. As the number summed increases they are each phase delayed by a smaller number (1/(switching frequency)*n) where "n" is the number of PAMCCs summed. Note that the summed current shown in FIG. 13 has only a fraction of the ripple current of an individual PAMCC (FIG. 12) and has eight times the ripple frequency of that of an individual PAMCC. If each PAMCC 400 is producing a point on a grid sine wave with its sequence of PAM current pulses, phasing and summing a set of PAMCCs, forming an array of converters, will effectively demodulate a grid sine wave of current with very high accuracy and very low noise (ripple). Any number of array converters may be phased and summed in this way. As the number of PAMCCs is increased, the ripple amplitude decreases and the ripple frequency increases. In one embodiment two or more of the plurality of PAMCC 400 individual output currents are in phase with each other. In some embodiments the switching frequency is selected so as to be unrelated to the grid frequency, for example 60 Hz in the United States, the ripple will not represent harmonic distortion. Signals modulated onto the PAMCC output are arbitrary. In some embodiments multiple signals are modulated onto the PAMCC output, wherein one of such signals may, for example, provide for communication between an arbitrary two or more PAMCC modules. The PAMCC modulation is sometimes used to correct for distortion in the grid signal.

One of several ways to choose the phasing of the arrayed PAMCCs 400 is for each PAMCC 400 to be pre-assigned a timing slot number, with the first slot being scheduled following a zero crossing and each PAMCC 400 firing its PAM signal in the predetermined (i.e., assigned) sequence.

Figure 14:
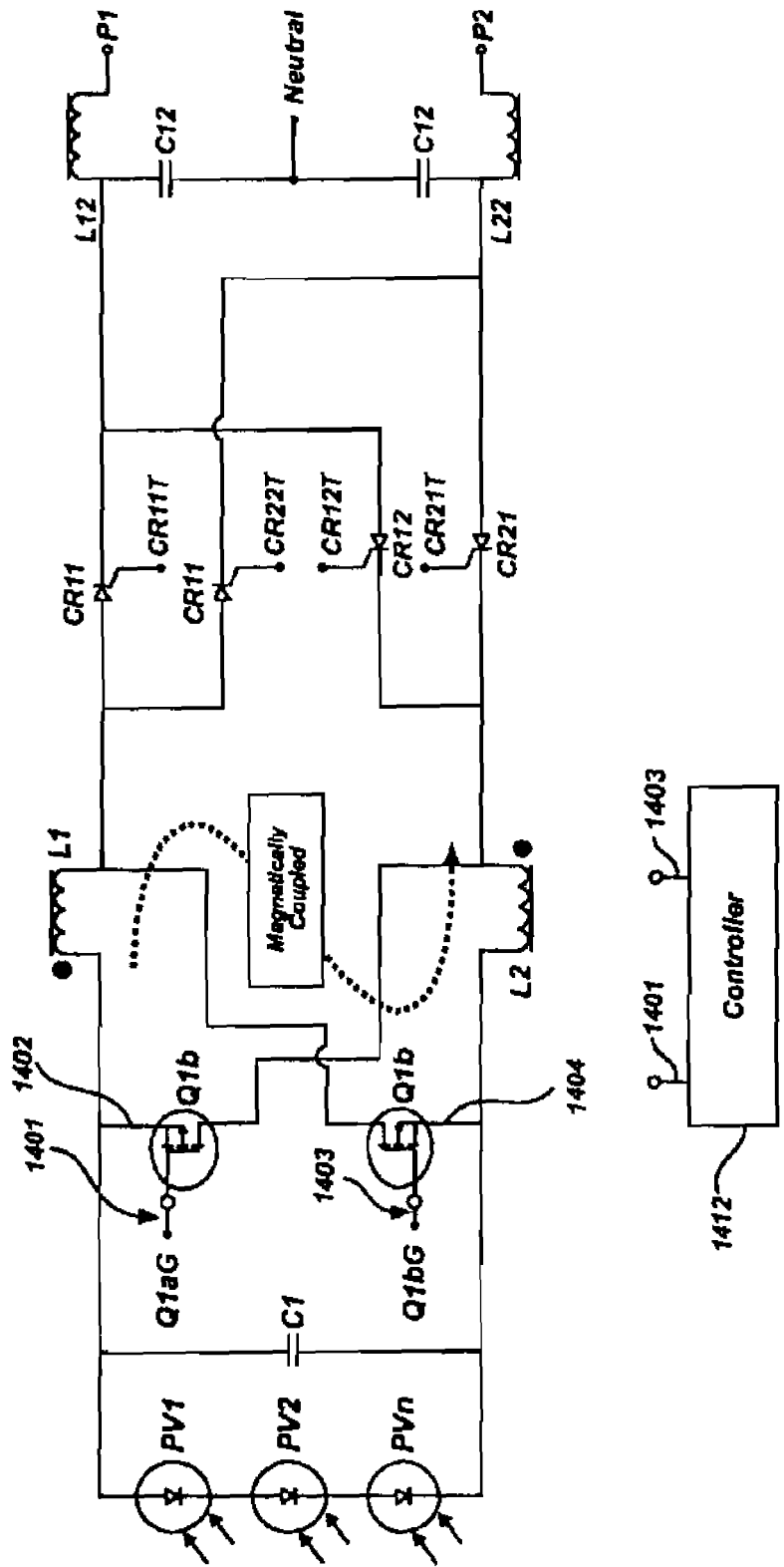
FIG. 14 shows an alternative circuit for a single pulse amplitude modulated current converter.

In an alternative embodiment, exemplified in FIG. 14, a second transistor is added, wherein Q 1 A 1402 and Q 1 B 1404 replace the single transistor Q 1 404 as was shown and described in the circuit of FIG. 4. Using the two transistors Q 1 A 1402 and Q 1 B 1404 provides some potential advantages, including reducing the voltage across each transistor, allowing a more relaxed Rds_on (the "on" resistance) requirement for each transistor compared to the Rds_on requirement of Q 1 404, and allowing each transistor to be driven with respect to the relatively low voltage and stable anode and cathode ends of PV 401. In this configuration, Q 1 A 1402 and Q 1 B 1404 are both turned on and off at the same times as with Q 1 404 in the previous discussion. All other aspects of the circuit operation remain the same. Q 1 A 1402 and Q 1 B 1404 are of different transistor types, so separate signals to their control gates are provided by the control 1412. Controller 1412 is otherwise the same as controller 412 of FIG. 12, with the addition of output terminals connected to the control gates of Q 1 A 1402 and Q 1 B 1404 via lines 1401 and 1403 respectively.

Figure 15:
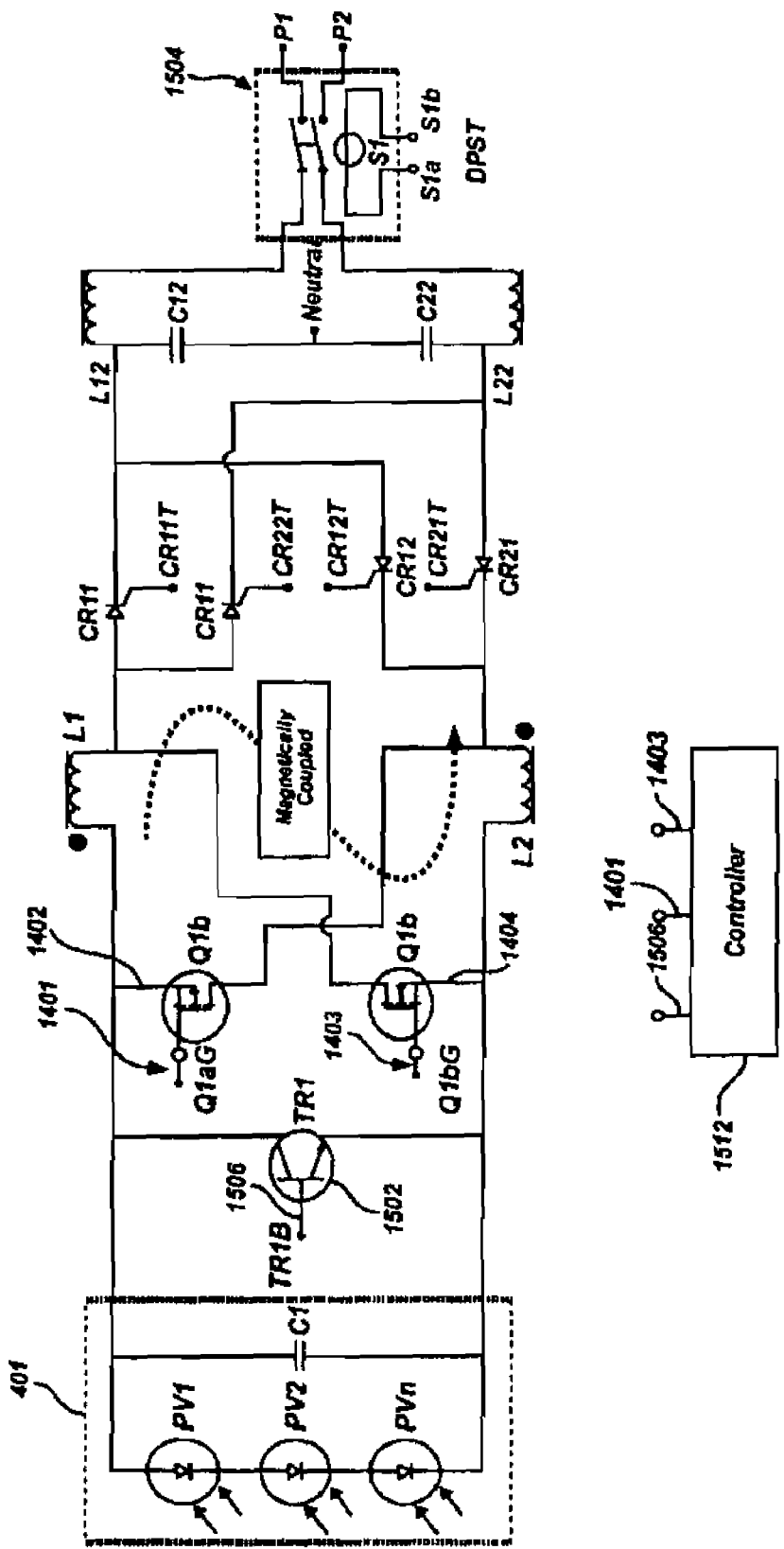
FIG. 15 shows a circuit for a single pulse amplitude modulated current converter wherein the converter can be disabled.
Figure 16:
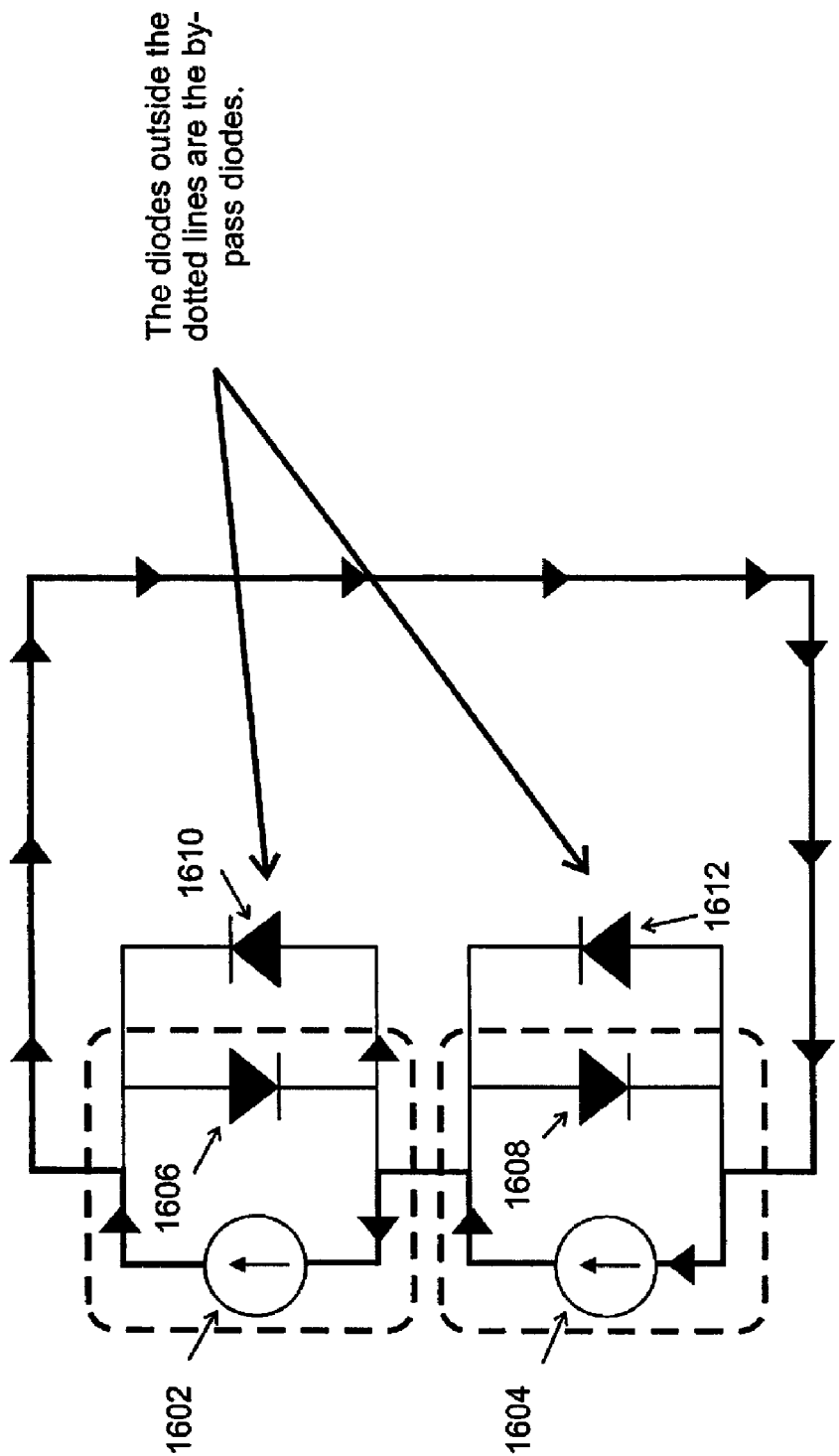
FIG. 16 is an electrical model of a solar panel.
Figure 17:
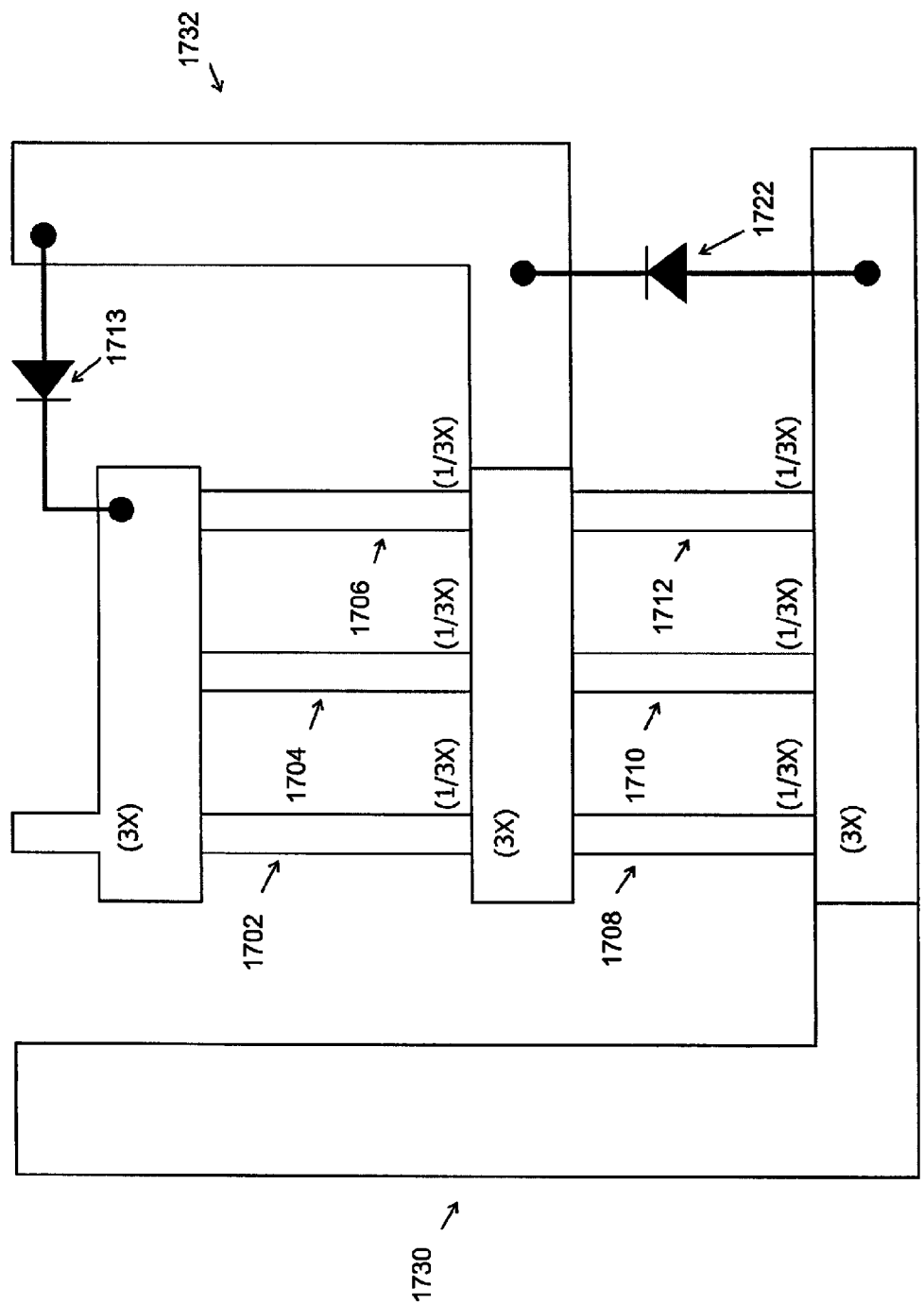
FIG. 17 is an example physical layout of a typical solar panel, specifically related to the area needed for interconnect.
Figure 18:
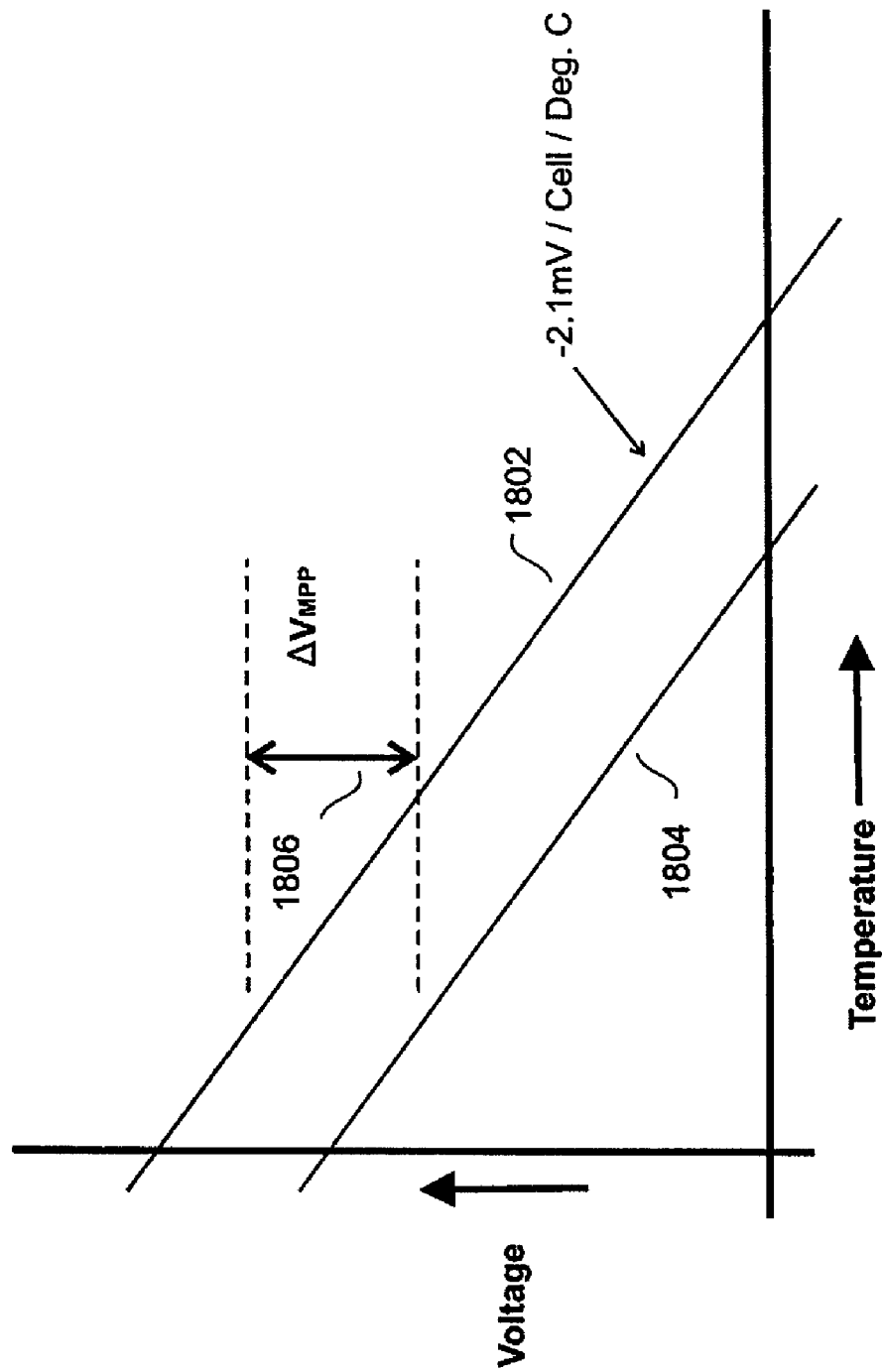
FIG. 18 is a graph relating the output voltage of a solar panel to the temperature of the solar panel.

In some embodiments the system may be shut down for safety, maintenance, or other purposes. One example of a shut-down method is shown in FIG. 15. A transistor TR 1 1502 and a relay S 1 1504 are added as shown. Note that this example includes the two transistors Q 1 A 1402 and Q 1 B 1404, however the same shut-down provision can be added to the circuit of FIG. 4, wherein the two transistors Q 1 A and Q 1 B are replaced by the single transistor Q 1 404. Transistor TR 1 1502 and relay S 1 1504 provide for the safe shutdown of PAMCC while connected to PV 401, which is illuminated and producing power. The shutdown process is initiated by providing a signal TR 1 B from controller 1512 on a line 1506, the line 1506 connected to the control gate of the transistor 1502. When transistor TR 1 1502 turns on, TR 1 creates a short path for current produced by PV 401, which results in the voltage across PV 401 to be reduced to a small level. At this point, Q 1 A 1402 and Q 1 C 1404 are energized to allow the currents in the coils L 1 406 and L 2 405 to fall to a low level. After the coils L 1 and L 2 are discharged, relay S 1 1504 is opened. With the path to the grid now open, Q 1 A 1402 and Q 1 B 1404 are turned off, followed by turning off transistor TR 1 1502. In this configuration, no further power will be produced.

According to the present invention, a solar panel is controlled by an electronic module, the module including means for measuring the temperature of the panel cells, the voltage across the panel, and for controlling the power (current) provided by the panel. A solar panel may be expected to provide a certain output voltage under good operating conditions, as determined by specification, characterization data, or by the experience derived by accumulating performance data over time. The current available is a function of the intensity of sunlight incident upon the panel, and the voltage a function of the temperature of the cells, assuming otherwise normal conditions for the cells. As described hereinbefore, a weak cell, due to damage, deterioration, soil, or simply partial shading of the panel, will not provide the same power as will the other, unaffected cells. Because all cells in a string are electrically in series, the current must be in common. Therefore the only way the weak cell can adjust for the instant lower power capacity is by a lower voltage for that cell. Again because the cells are electrically connected in series, the voltage across the string will be the sum of the voltages of all the cells in the string. Obviously, then, when a cell in the string loses some voltage, the whole string does as well.

An electronic module typically tests a panel periodically, for example once per hour, to determine the maximum power point (MPPT) operating condition. This is accomplished by varying the current demanded from a panel, measuring the voltage across the panel, then determining the power for that condition as the product of voltage times current. By varying across a certain range of currents, a peak power point may be found. In the prior art, such MPPT testing is done without regard to whether the condition selected may drive a weak cell in a string into a forward bias condition, thereby causing the bypass diodes to be forward biased, as described hereinbefore. According to the present invention, the electronic module first determines the temperature of the solar panel cells, determines expected panel voltage for the temperature found, and does not allow the current to cause the voltage to drop more than a predetermined amount below the expected voltage. For example, in one embodiment the maximum value below MPP to be allowed is:

$$RT\ MPP - tolerance - degredation(temp)$$

wherein RT MPP is the maximum power point condition for room temperature, "tolerance" is a value provided by the solar panel manufacturer, and degredation(temp) is the diode drop value that results from increasing temperature, for example −2.1 my/degree C. for a silicon solar cell. Of course these values will be different for other solar cell chemistries.

The result is that, if there were in fact bypass diodes the bypass diodes would never be forward biased, therefore the diodes are not needed and a solar panel designed for an electronic module according to the present invention is made without bypass diodes, thereby saving the area that would be required for the interconnect of the bypass diodes.

Consider an example, wherein a set of twenty-five modules are connected in parallel form a total array of 5,250 W. Each panel is controlled by an individual electronic module connected to the panel, for example an Array Converter as disclosed in the '025 application, wherein the electronic module includes means for measuring the voltage across the strings and for controlling the current demanded from its associated module. Assume each module is constructed of one string of 114 cells (mpp @492 mV, 3.743 A). If one cell became shaded or soiled to the extent that it's current dropped by 374 mA (10%) then the power for that module only would be reduced by 10%. The array converter will only be permitted the MPP solution of approximately 56.088V*3.369 or 189 w (10% loss). This is because any solution lower than 90% (a programmable limit) of nominal Vmp at the measured temperature would not be allowed as an MPPT solution. This ensures that an Array Converter would not reverse a cell by more than 5.6V (half the amount of the bypass diode approach) even during an MPPT search.

Since the other 24 array converter modules would remain unaffected, the total power is 5,228 w vs 5,140 w for the string inverter case. The single module with the single shaded cell does not dissipate any additional power.

What is claimed is:

1. A method for controlling the operation of a solar panel by an electronic module, wherein the electronic module includes means for measuring a value of the temperature of the solar panel and means for measuring a value of the voltage across the solar panel and means for configuring the electronic module to demand more or less current from the solar panel, comprising:
   determining a value of the temperature of the solar panel;
   determining an expected output voltage of the solar panel as a function of the value of the temperature;
   determining an instant value of the output voltage of the solar panel;
   comparing the instant value of the output voltage of the solar panel to the expected value of the output voltage of the solar panel; and
   configuring the electronic module so that a value of current drawn from the solar panel prevents the instant value of the output voltage from exceeding a negative difference value of the expected output voltage without the use of a bypass diode;
   wherein the negative difference value is determined by adjusting a maximum power point voltage condition by subtracting a tolerance value and by subtracting a temperature correction factor characteristic of the solar panel.

2. The method according to claim 1, wherein the expected output voltage is determined from a specification of the solar panel.

3. The method according to claim 1, wherein the expected output voltage is determined from data characteristic of the solar panel data.

4. The method according to claim 1, wherein the expected output voltage is determined according to weather data.

5. The method according to claim 1, wherein the expected output voltage is determined by calculating a rolling average over time.

6. The method according to claim 1, wherein the expected output voltage is determined by comparing the output voltage of a given solar panel to the output voltage of other solar panels in a common system.

7. The method according to claim 1 wherein the negative difference value is predetermined by a manufacturer of the solar panel.

8. An electronic module configured to control operations of a solar panel, comprising:
   a processor;
   a temperature sensing circuit coupled to the processor and configured for measuring the temperature of the solar panel;
   a voltage sensing circuit coupled to the processor and configured for measuring a value of the voltage across the solar panel; and
   a current regulating circuit coupled to the processor and configured to demand more or less current from the solar panel,
   wherein the processor is configured with processor-executable instructions to perform operations comprising:
   determining a temperature of the solar panel;
   determining an expected output voltage of the solar panel as a function of the value of the temperature;
   determining an instant output voltage of the solar panel;
   comparing the instant output voltage of the solar panel to the expected output voltage of the solar panel; and
   configuring the electronic module so that a current drawn from the solar panel prevents the instant output voltage from exceeding a negative difference value of the expected output voltage without the use of a bypass diode;

wherein the processor is configured to determine the negative difference value by adjusting a maximum power point voltage condition by subtracting a tolerance value and by subtracting a temperature correction factor characteristic of the solar panel.

9. The electronic module of claim 8, wherein the processor is configured to determine the expected output voltage from a specification of the solar panel.

10. The electronic module of claim 8, wherein the processor is configured to determine the expected output voltage from data characteristic of the solar panel.

11. The electronic module of claim 8, wherein the processor is configured to determine the expected output voltage according to weather data.

12. The electronic module of claim 8, wherein the processor is configured to determine the expected output voltage by calculating a rolling average over time.

13. The electronic module of claim 8, wherein the processor is configured to determine the expected output voltage by comparing the output voltage of a given solar panel to the output voltage of other solar panels in a common system.

14. The electronic module of claim 8, wherein the processor is configured with the negative difference value that is predetermined by a manufacturer of the solar panel.

15. A solar panel system, comprising:
a solar panel; and
an electronic module configured to control the operation of the solar panel, comprising:
a processor;
a temperature sensing circuit coupled to the processor and configured for measuring the temperature of the solar panel;
a voltage sensing circuit coupled to the processor and configured for measuring a value of the voltage across the solar panel; and
a current regulating circuit coupled to the processor and configured to demand more or less current from the solar panel,
wherein the processor is configured with processor-executable instructions to perform operations comprising:
determining a temperature of the solar panel;
determining an expected output voltage of the solar panel as a function of the value of the temperature;
determining an instant output voltage of the solar panel;
comparing the instant output voltage of the solar panel to the expected output voltage of the solar panel; and
configuring the electronic module so that a current drawn from the solar panel prevents the instant output voltage from exceeding a negative difference value of the expected output voltage without the use of a bypass diode;
wherein the processor is configured to determine the negative difference value by adjusting a maximum power point voltage condition by subtracting a tolerance value and by subtracting a temperature correction factor characteristic of the solar panel.

16. The solar panel system of claim 15, wherein the processor is configured to determine the expected output voltage from a specification of the solar panel.

17. The solar panel system of claim 15, wherein the processor is configured to determine the expected output voltage from data characteristic of the solar panel.

18. The solar panel system of claim 15, wherein the processor is configured to determine the expected output voltage according to weather data.

19. The solar panel system of claim 15, wherein the processor is configured to determine the expected output voltage by calculating a rolling average over time.

20. The solar panel system of claim 15, wherein the processor is configured to determine the expected output voltage by comparing the output voltage of a given solar panel to the output voltage of other solar panels in a common system.

21. The solar panel system of claim 15, wherein the processor is configured with the negative difference value that is predetermined by a manufacturer of the solar panel.

* * * * *